(12) United States Patent
Maeda

(10) Patent No.: US 8,508,303 B2
(45) Date of Patent: Aug. 13, 2013

(54) DIGITAL FREQUENCY/PHASE LOCKED LOOP

(75) Inventor: Masakatsu Maeda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/256,748

(22) PCT Filed: Feb. 5, 2010

(86) PCT No.: PCT/JP2010/000711
§ 371 (c)(1),
(2), (4) Date: Sep. 15, 2011

(87) PCT Pub. No.: WO2010/113377
PCT Pub. Date: Oct. 7, 2010

(65) Prior Publication Data
US 2012/0013409 A1   Jan. 19, 2012

(30) Foreign Application Priority Data
Apr. 1, 2009 (JP) ................................. 2009-089216

(51) Int. Cl.
*H03L 7/099* (2006.01)
(52) U.S. Cl.
USPC .................. 331/1 A; 331/1 R; 331/16; 331/17
(58) Field of Classification Search
USPC ....................... 331/1 A, 1 R, 16, 17; 375/376
See application file for complete search history.

(56) References Cited

U.S. PATENT DOCUMENTS

| 5,534,823 | A |   | 7/1996 | Kondou |
|---|---|---|---|---|
| 5,703,539 | A | * | 12/1997 | Gillig et al. ..................... 331/16 |
| 6,760,575 | B2 |   | 7/2004 | Welland |

(Continued)

FOREIGN PATENT DOCUMENTS

| JP | 7-288471 | 10/1995 |
|---|---|---|
| JP | 2007-143012 | 6/2007 |

(Continued)

OTHER PUBLICATIONS

International Search Report issued Mar. 23, 2010 in corresponding International Application No. PCT/JP2010/000711.

(Continued)

*Primary Examiner* — Joseph Chang
*Assistant Examiner* — Jeffrey Shin
(74) *Attorney, Agent, or Firm* — Wenderoth, Lind & Ponack, L.L.P.

(57) ABSTRACT

A digital FLL/PLL is provided which is capable of converging an oscillation frequency from a VCO to a desired frequency at a high speed even without setting a damping factor corresponding to each VCO gain. A digital FLL/PLL of the present invention includes: a comparator for comparing a channel signal to a loopback signal having an oscillation frequency to generate a signal error; a digital loop filter for generating a control voltage that determines the oscillation frequency, on the basis of the signal error; a VCO for controlling an oscillation frequency on the basis of the control voltage; a loopback path through which the oscillation frequency generated by the VCO is outputted as the loopback signal to the comparator; and a control section for monitoring the signal error, and controlling the digital loop filter such that the oscillation frequency of the VCO becomes a stationary state, when detecting that the signal error meets a predetermined condition after the channel signal is switched.

9 Claims, 23 Drawing Sheets

(56) References Cited

U.S. PATENT DOCUMENTS

| | | | |
|---|---|---|---|
| 7,339,861 B2* | 3/2008 | Minamino et al. | 369/47.28 |
| 7,501,900 B2* | 3/2009 | Hull et al. | 331/16 |
| 7,579,919 B1* | 8/2009 | Cao | 331/176 |
| 2002/0080901 A1* | 6/2002 | Ham, III | 375/376 |
| 2003/0062957 A1* | 4/2003 | Terashima et al. | 331/17 |
| 2004/0146132 A1* | 7/2004 | Staszewski et al. | 375/376 |
| 2006/0109147 A1 | 5/2006 | Sander et al. | |
| 2007/0013446 A1* | 1/2007 | Navil et al. | 331/16 |
| 2007/0093217 A1 | 4/2007 | Maeda et al. | |
| 2009/0021312 A1 | 1/2009 | Kimura et al. | |
| 2009/0052508 A1 | 2/2009 | Takahashi | |
| 2009/0072911 A1* | 3/2009 | Ke et al. | 331/16 |

FOREIGN PATENT DOCUMENTS

| | | |
|---|---|---|
| JP | 2007-259431 | 10/2007 |
| JP | 2009-21954 | 1/2009 |
| JP | 2009-027581 | 2/2009 |
| WO | 2007/046304 | 4/2007 |

OTHER PUBLICATIONS

Dean Banerjee, "PLL Performance, Simulation, and Design" $4^{th}$ Edition, 2006, pp. 125-133.

Mark Van Paemel, "Analysis of a Charge-Pump PLL: A New Model", IEEE Transactions on Communications, vol. 42, No. 7, Jul. 1994, pp. 2490-2498.

* cited by examiner

F I G. 3
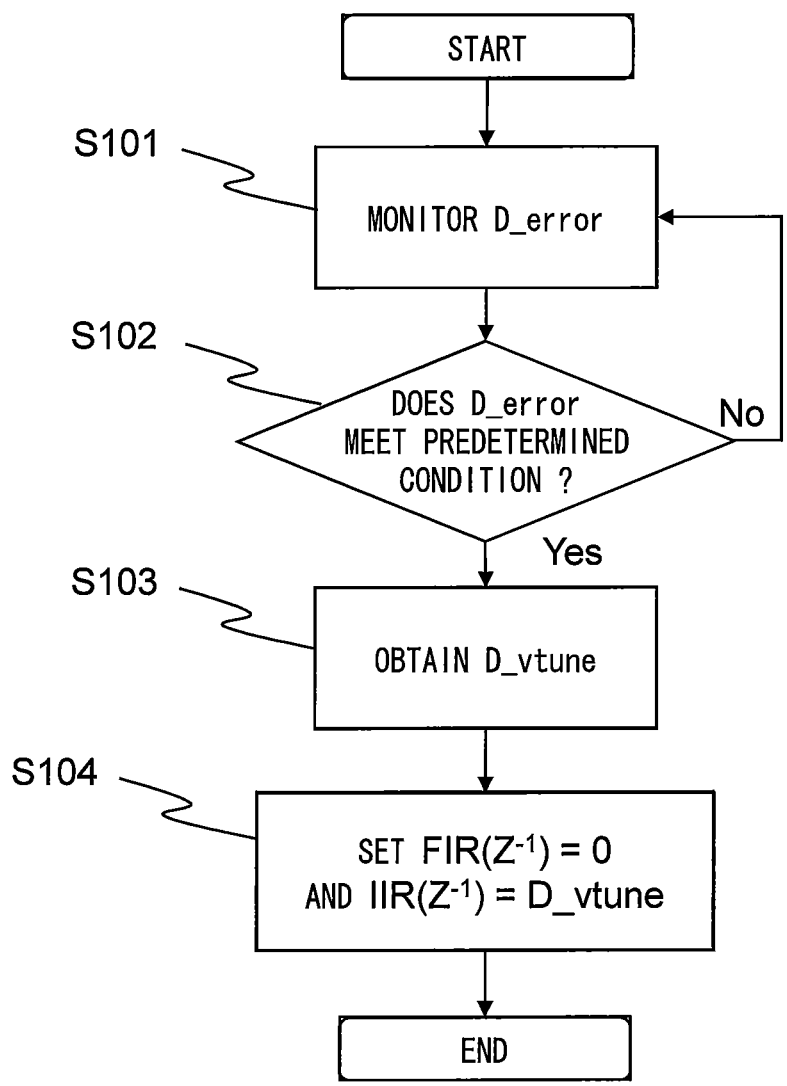

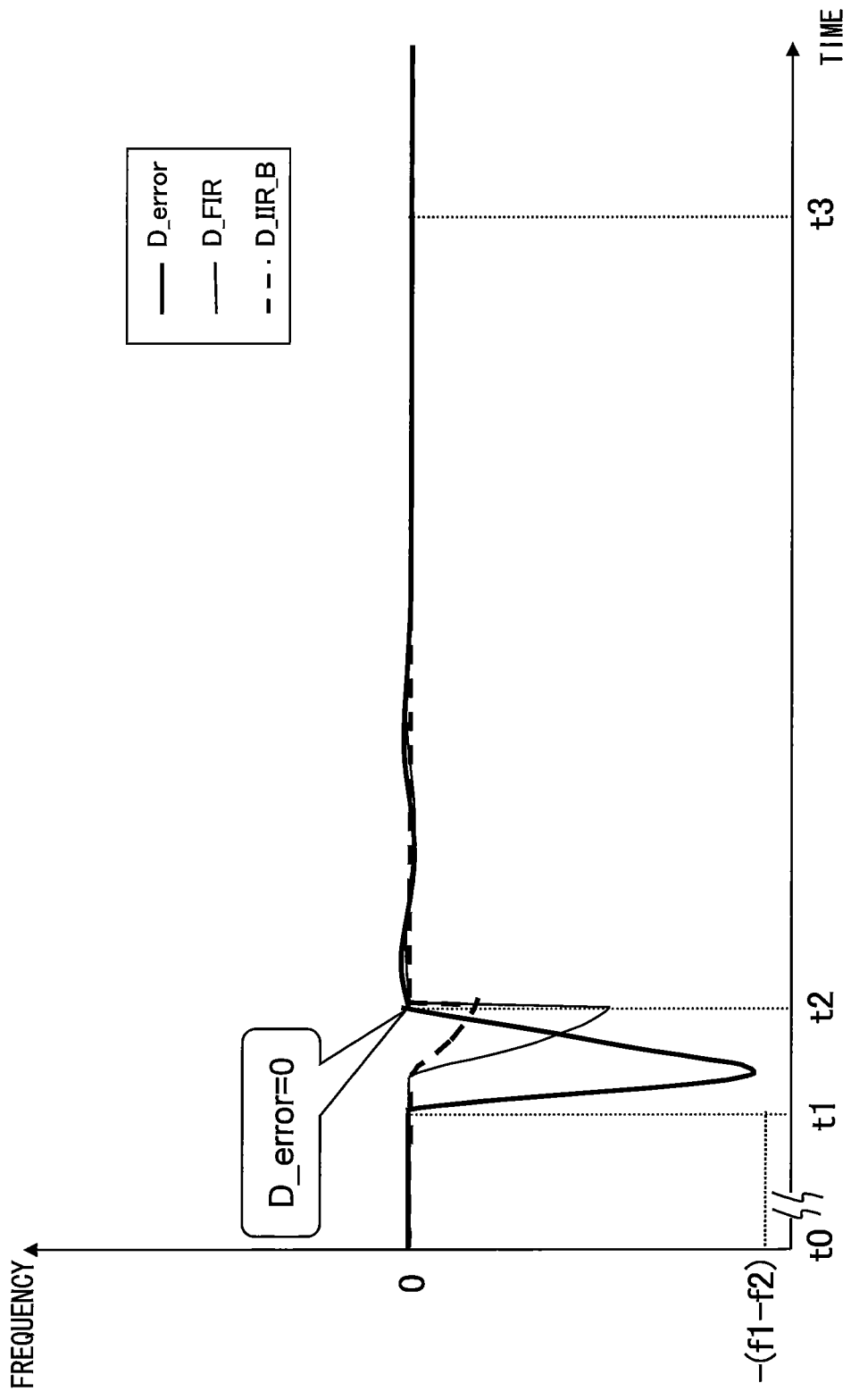

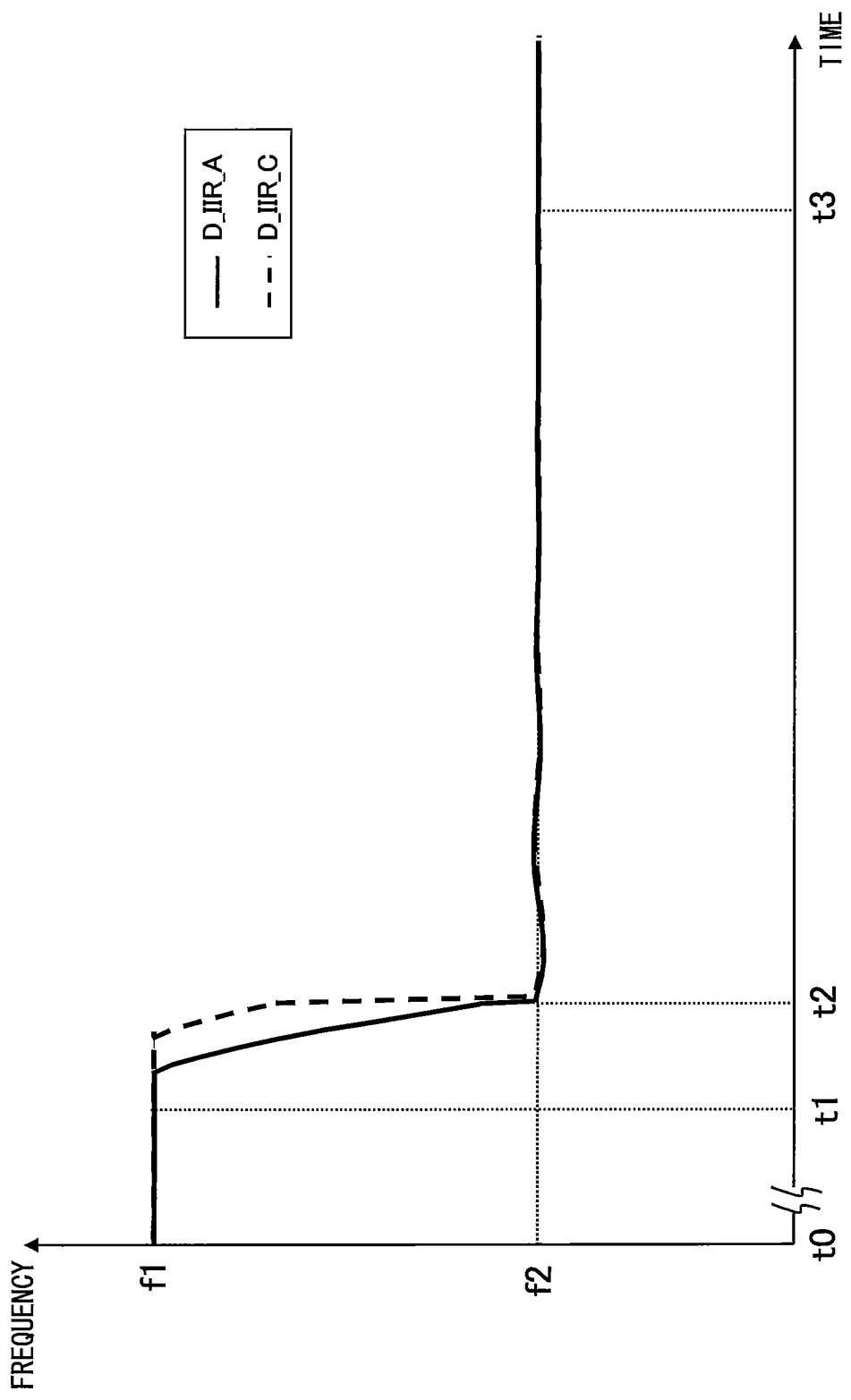

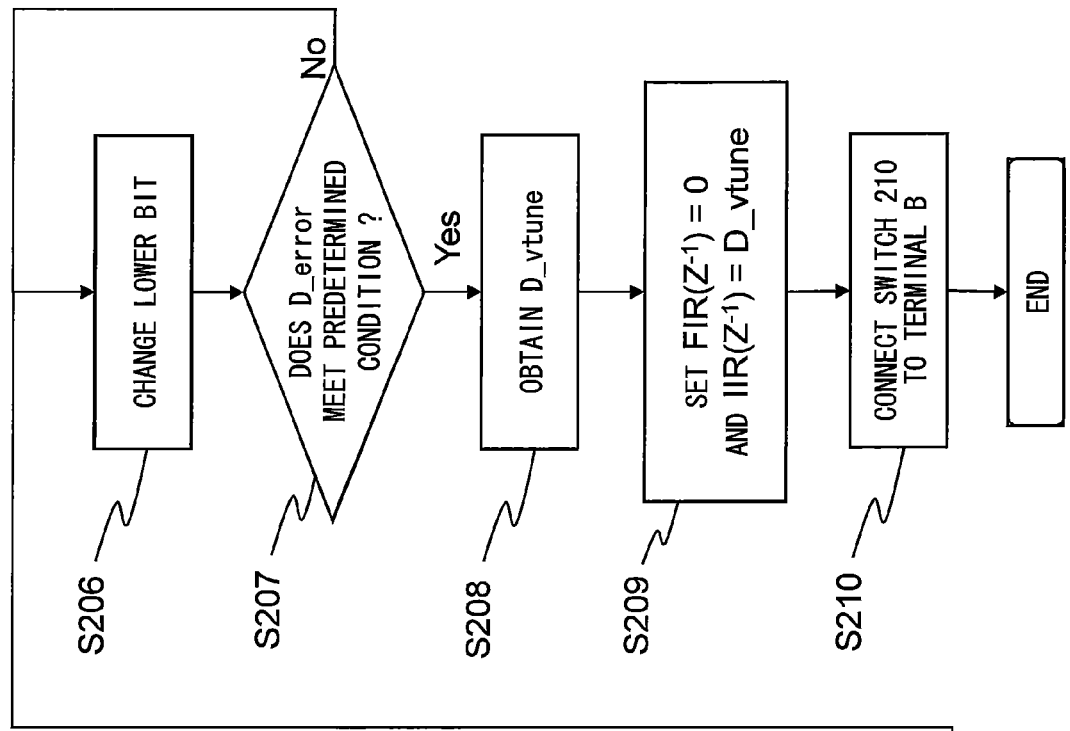
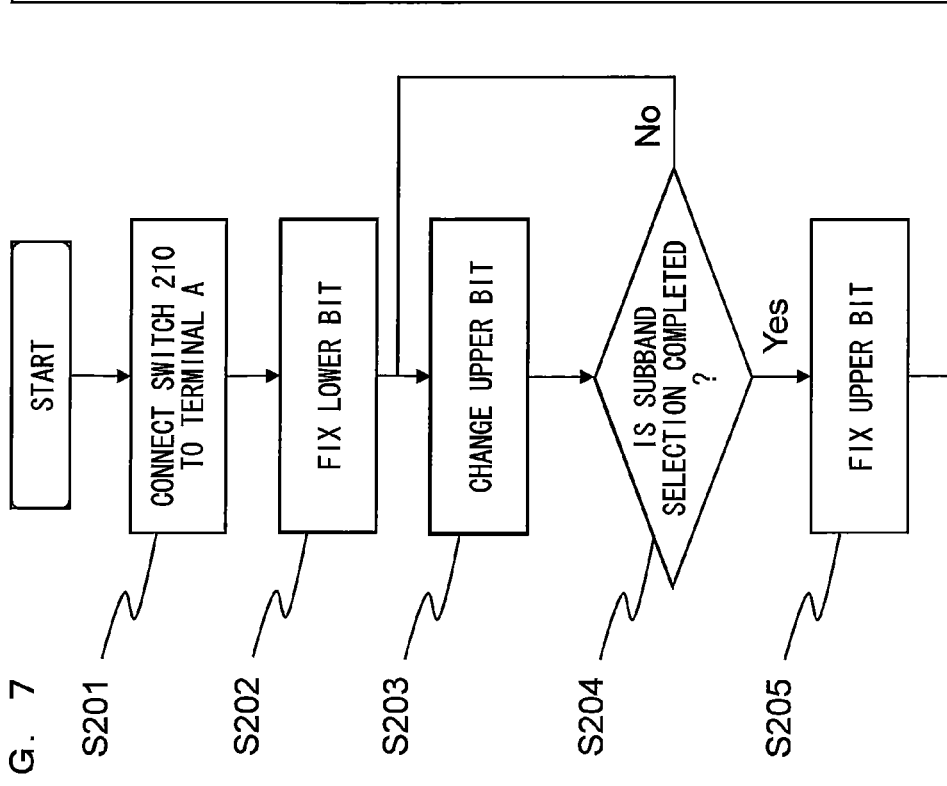
FIG. 7

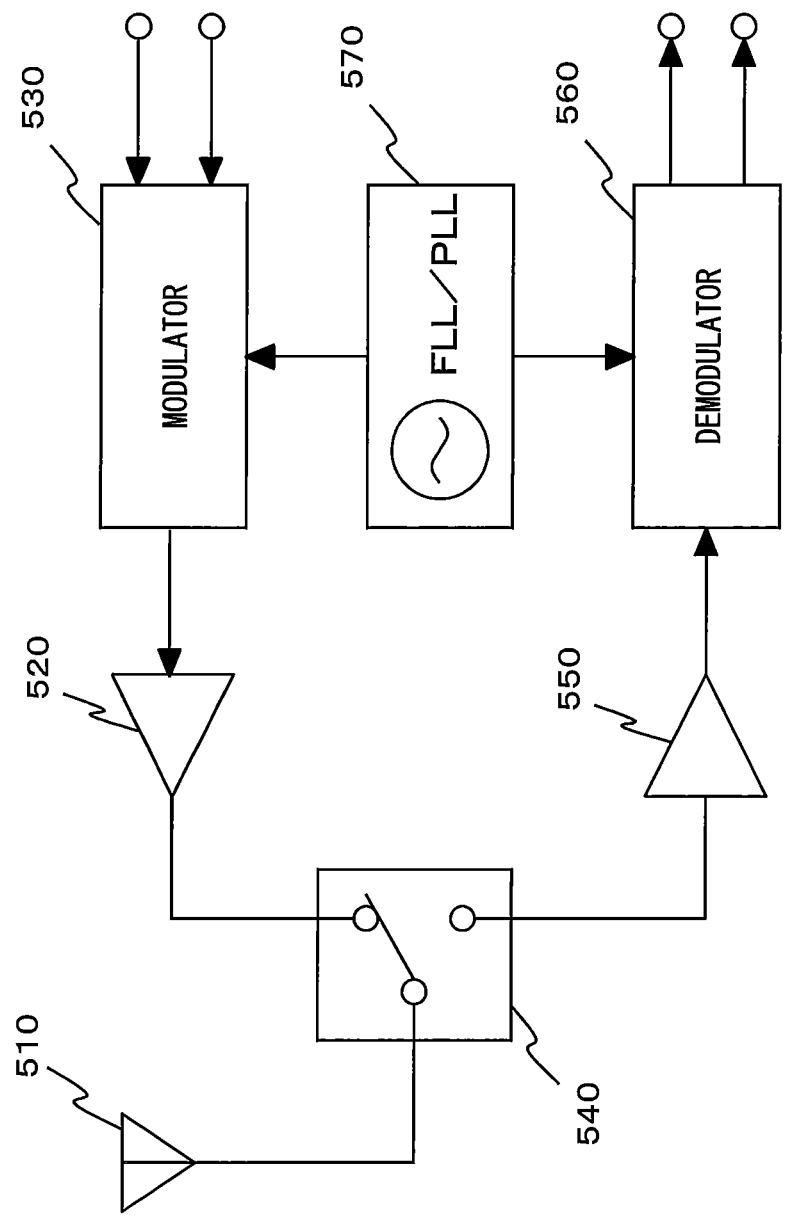
F I G. 1 1

DIGITAL FREQUENCY/PHASE LOCKED LOOP

TECHNICAL FIELD

The present invention relates to a digital frequency/phase locked loop (FLL: Frequency Locked Loop, PLL: Phase Locked Loop) used in a wireless communication device or the like, and, more specifically, relates to a digital FLL/PLL that converges an oscillation frequency to a desired frequency at a high speed on the basis of a signal error that is the difference between a channel signal and the oscillation frequency.

BACKGROUND ART

In recent years, with technology of wireless LAN, third-generation mobile phone, digital broadcasting, and the like, digitalized communication/broadcasting has a purpose of switching the frequency of a channel signal. As a method for converging a frequency outputted from a wireless communication device or the like to the frequency of a channel signal when switching the frequency of the channel signal as described above, technology using a digital FLL/PLL is known.

FIG. 12 is a diagram illustrating a digital FLL 900 in the conventional art. In FIG. 12, the digital FLL 900 includes a frequency comparator 910, an FIR filter 920, an IIR filter 930, a digital-analogue convertor (DAC) 940, a voltage-controlled oscillator (VCO) 950, and a frequency-digital convertor 960.

The frequency comparator 910 compares a channel signal D_ref inputted to the digital FLL 900 to a loopback signal D_vco and outputs a frequency error signal D_error between the channel signal D_ref and the loopback signal D_vco. The FIR filter 920 and the IIR filter 930 output a control voltage signal D_vtune on the basis of the frequency error D_error outputted from the frequency comparator 910.

Here, the FIR filter 920 includes first to third delay blocks $Z^{-1}$ 921 to 923, first and second adders 924 and 925, and a multiplier 926 having a fixed multiplying factor of ⅓. The FIR filter 920 performs a moving average process on the frequency error D_error by using the third delay blocks $Z^{-1}$ 921 to 923. In addition, the IIR filter 930 includes first and second multipliers 931 and 933, first and second adders 932 and 934, and a delay block $Z^{-1}$ 935. An output of the FIR filter 920 is inputted to the first multiplier 931 and the first adder 932 of the IIR filter 930. The first multiplier 931 multiplies the output of the FIR filter 920 by a weighting factor β. The first adder 932 adds an output of the second multiplier 933 to the output of the FIR filter 920. The second multiplier 933 multiplies an output of the first adder 932 looped back via the delay block $Z^{-1}$ 935, by a weighting factor α. The second adder 934 sums an output of the first multiplier 931 and an output of the first adder 932, and outputs the summed output as the control voltage signal D_vtune to the DAC 940.

The control voltage signal D_vtune is analogue-converted by the DAC 940 and then inputted to the VCO 950. The VCO 950 controls an oscillation frequency fout outputted from the VCO 950, on the basis of the inputted control voltage signal. The oscillation frequency fout generated by the VCO 950 is digital-converted by the frequency-digital convertor 960 and returns as the loopback signal D_vco to the frequency comparator 910.

In this manner, the digital FLL 900 generates the control voltage signal D_vtune on the basis of the frequency error signal D_error between the channel signal D_ref and the loopback signal D_vco, and further controls the oscillation frequency fout outputted from the VCO 950, on the basis of the control voltage signal D_vtune.

FIG. 13 is a diagram illustrating a situation where the oscillation frequency fout from the VCO 950 of the digital FLL 900 in the conventional art converges to a desired frequency. In FIG. 13, between times t0 and t1, the reference frequency of the channel signal D_ref and the oscillation frequency fout from the VCO 950 are in a stationary state at the same frequency f1.

When the frequency of the channel signal D_ref is switched from f1 to f2 at time t1, the oscillation frequency fout from the VCO 950 does not instantly come into a stationary state at the frequency f2. The oscillation frequency fout from the VCO 950 converges to the desired frequency f2 with repeated vibrations, and substantially comes into a stationary state at time t3.

The reason why the oscillation frequency fout from the VCO 950 converges to the desired frequency f2 with repeated vibrations as described above is that due to group delays of the FIR filter 920 and the IIR filter 930, the frequency error signal D_error is not instantly transferred.

FIG. 14A is a diagram illustrating the frequency error signal D_error that is an output from the frequency comparator 910, D_FIR that is an output from the FIR filter 920, and D_IIR_B that is an output from the first multiplier 931 of the IIR filter 930. FIG. 14B is a diagram illustrating D_IIR_A that is an output from the first adder 932 of the IIR filter 930, and D_IIR_C that is an output from the second multiplier 933 of the IIR filter 930. Hereinafter, timings of operations of the digital FLL 900 will be described with reference to FIGS. 14A and 14B.

Between times t0 and t1 between which the oscillation frequency fout from the VCO 950 is in a stationary state at the frequency f1, the frequencies of the frequency error signal D_error, D_FIR, and D_IIR_B are in a stationary state at 0 in FIG. 14A, and the frequencies of D_IIR_A and D_IIR_C are in a stationary state at f1 in FIG. 14B.

Here, when the frequency of the channel signal D_ref is switched from f1 to f2 at time t1, the frequency of D_error rapidly falls to near —(f1-f2) in FIG. 14A. This is because the frequency of the channel signal D_ref is switched to f2 at time t1 but the frequency of the oscillation frequency fout does not instantly become f2. The frequency difference between the channel signal D_ref and the loopback signal D_vco based on the oscillation frequency fout becomes about —(f1-f2), and the frequency comparator 910 outputs a frequency error signal D_error having a frequency of —(f1-f2).

Then, the FIR filter 920 outputs D_FIR on the basis of the frequency error D_error outputted from the frequency comparator 910. In FIG. 14A, D_FIR delays from D_error. This is due to the delay properties of the FIR filter 920 (the third delay blocks $Z^{-1}$ 921 to 923 and the like). Further, D_FIR is multiplied by the weighting factor β by the first multiplier 931 of the IIR filter 930 and outputted as D_IIR_B. Here, the weighting factor β=0.3.

Further, when the frequency of the channel signal D_ref is switched from f1 to f2 at time t1, the frequency of D_IIR_A falls from f1 to f2 slightly after time t1 in FIG. 14B. This is because D_IIR_A is obtained by adding the output of the second multiplier 933 to D_FIR, which is the output of the FIR filter 920, and thus influenced by the above delay properties of the FIR filter 920. Then, D_IIR_C is obtained by looping back the above D_IIR_A via the delay block $Z^{-1}$ 935 and multiplying D_IIR_A by the weighting factor α by the second multiplier 933 of the IIR filter 930, and thus further delays from D_IIR_A. Here, the weighting factor α=1.0.

As described above, according to the digital FLL 900, when the frequency of the channel signal D_ref is switched from f1 to f2 at time t1, due to the group delays of the FIR filter 920 and the IIR filter 930, the frequency error signal D_error is not instantly transferred, and the oscillation frequency fout from the VCO 950 converges to the desired frequency f2 while repeatedly vibrating in a regular attenuation vibration cycle T (=1/ωn (ωn: natural frequency). In other words, in the digital FLL 900, it takes a certain time (time t3−time t1) until the oscillation frequency fout from the VCO 950 converges to the desired frequency f2. The above conventional art is disclosed, for example, in Non-Patent Literature 1.

CITATION LIST

[Non Patent Literature]
 [NPL 1] Dean Banerjee, "PLL Performance, Simulation, and Design 4th Edition", [online], [searched on Jan. 28, 2009], Internet <http://www.national.com/appinfo/wireless/files/deansbook4.pdf>.

SUMMARY OF THE INVENTION

Problems to be Solved by the Invention

Here, when the natural frequency (ωn is increased by reducing the operation load of the digital filter (the FIR filter 920 and the IIR filter 930) only when switching the frequency of the channel signal D_ref, the attenuation vibration cycle T becomes low, and thus the oscillation frequency fout from the VCO 950 can be converged to the desired frequency at a high speed.

However, when the VCO gain varies, it is necessary to adjust the natural frequency ωn by setting a damping factor corresponding to each VCO gain. In other words, a desired natural frequency ωn is not obtained unless the damping factor is corrected as appropriate by using the actual measured value of each VCO gain. Thus, when converging the oscillation frequency from the VCO to the desired frequency, the effect of speedup is not exerted at 100%.

Therefore, an object of the present invention is to provide a digital FLL/PLL that is capable of converging an oscillation frequency from a VCO to a desired frequency at a high speed even without setting a damping factor corresponding to each VCO gain.

Solution to the Problems

To achieve the above object, according to a first aspect of the present invention, a digital FLL/PLL or controlling an outputted oscillation frequency on the basis of a signal error that is a difference between an inputted channel signal and the oscillation frequency. The digital frequency/phase locked loop comprises: a comparator for comparing the channel signal to a loopback signal having the oscillation frequency to generate the signal error; a digital loop filter for generating a control voltage that determines the oscillation frequency, on the basis of the signal error; a VCO for controlling an oscillation frequency on the basis of the control voltage; a loopback path through which the oscillation frequency generated by the VCO is outputted as the loopback signal to the comparator; and a control section for monitoring the signal error generated by the comparator, and controlling the digital loop filter such that the oscillation frequency of the VCO comes into a stationary state, when detecting that the signal error is within a predetermined range based on 0 after the channel signal is switched.

Further, the control section may monitor the signal error generated by the comparator, and may control the digital loop filter such that the oscillation frequency of the VCO comes into a stationary state, when detecting that the absolute value of the signal error is minimum after the channel signal is switched.

Further, the control section may monitor a temporal average of the signal error generated by the comparator. Further, the control section may control the digital loop filter by using a temporal average of the control voltage generated by the digital loop filter.

Further, the control section may have a function to correct a delay time occurring between an input and an output of the loopback path.

Preferably, the digital loop filter includes an FIR filter and an IIR filter, and the control section sets 0 to a delay block of the FIR filter, and sets the control voltage generated by the digital loop filter to a delay block of the IIR filter.

Further, preferably, the loopback path includes a frequency-digital convertor that performs analogue-digital conversion on the oscillation frequency generated by the VCO.

Further, preferably, the digital frequency/phase locked loop further comprises: a subband selection circuit for controlling selection of a subband in which the VCO oscillates at a desired frequency; and a switch, provided between the digital loop filter and the VCO, for switching between inputs of the control voltage generated by the digital loop filter and a control voltage from the subband selection circuit. The subband selection circuit fixes a control voltage inputted to the VCO, during the selection of the subband, and changes the control voltage inputted to the VCO, after the selection of the subband. The switch switches to connect the subband selection circuit to the VCO, at start of the selection of the subband, and switches to connect the digital loop filter to the VCO, when the oscillation frequency of the VCO comes into a stationary state.

Further, the digital frequency/phase locked loop may further comprise a DAC for performing digital-analogue conversion on the control voltage generated by the digital loop filter.

To achieve the above object, a second aspect of the present invention applies the digital FLL/PLL described above by incorporating the digital FLL/PLL into a wireless communication device or the like.

Advantageous Effects of the Invention

As described above, according to the present invention, the digital loop filter is controlled into a stationary state on the basis of the signal error, thereby implementing a digital FLL/PLL that is capable of converging the oscillation frequency from the VCO to a desired frequency at a high speed. In other words, the present invention does not converge the oscillation frequency from the VCO to a desired frequency at a high speed by adjusting the natural frequency ωn to decrease the attenuation vibration cycle T. Thus, even when the VCO gain varies, the present invention can converge the oscillation frequency from the VCO to a desired frequency at a high speed without making correction to a damping factor corresponding to each VCO gain. It should be noted that when a stationary state is provided in a short time after the frequency of the channel signal is switched, each device can be set in a sleep mode and thus reduction of current consumption can be achieved.

BRIEF DESCRIPTION OF THE DRAWINGS

FIG. 3 is a flowchart illustrating an operation of a control section 170 of the digital FLL 100 according to the first embodiment of the present invention.

FIG. 4A is a diagram illustrating a frequency error signal D_error that is an output from a frequency comparator 110, D_FIR that is an output from an FIR filter 120, and D_IIR_B that is an output from a first multiplier 131 of an IIR filter 130.

FIG. 4B is a diagram illustrating D_IIR_A that is an output from a first adder 132 of the IIR filter 130, and D_IIR_C that is an output from a second multiplier 133 of the IIR filter 130.

FIG. 7 is a flowchart illustrating an operation of the digital FLL 200 according to the second embodiment of the present invention.

FIG. 11 is a diagram illustrating a wireless communication device 500 according to a fifth embodiment of the present invention.

DESCRIPTION OF EMBODIMENTS

Hereinafter, each embodiment of the present invention will be described with reference to the drawings.

(First Embodiment)

Figure 1:
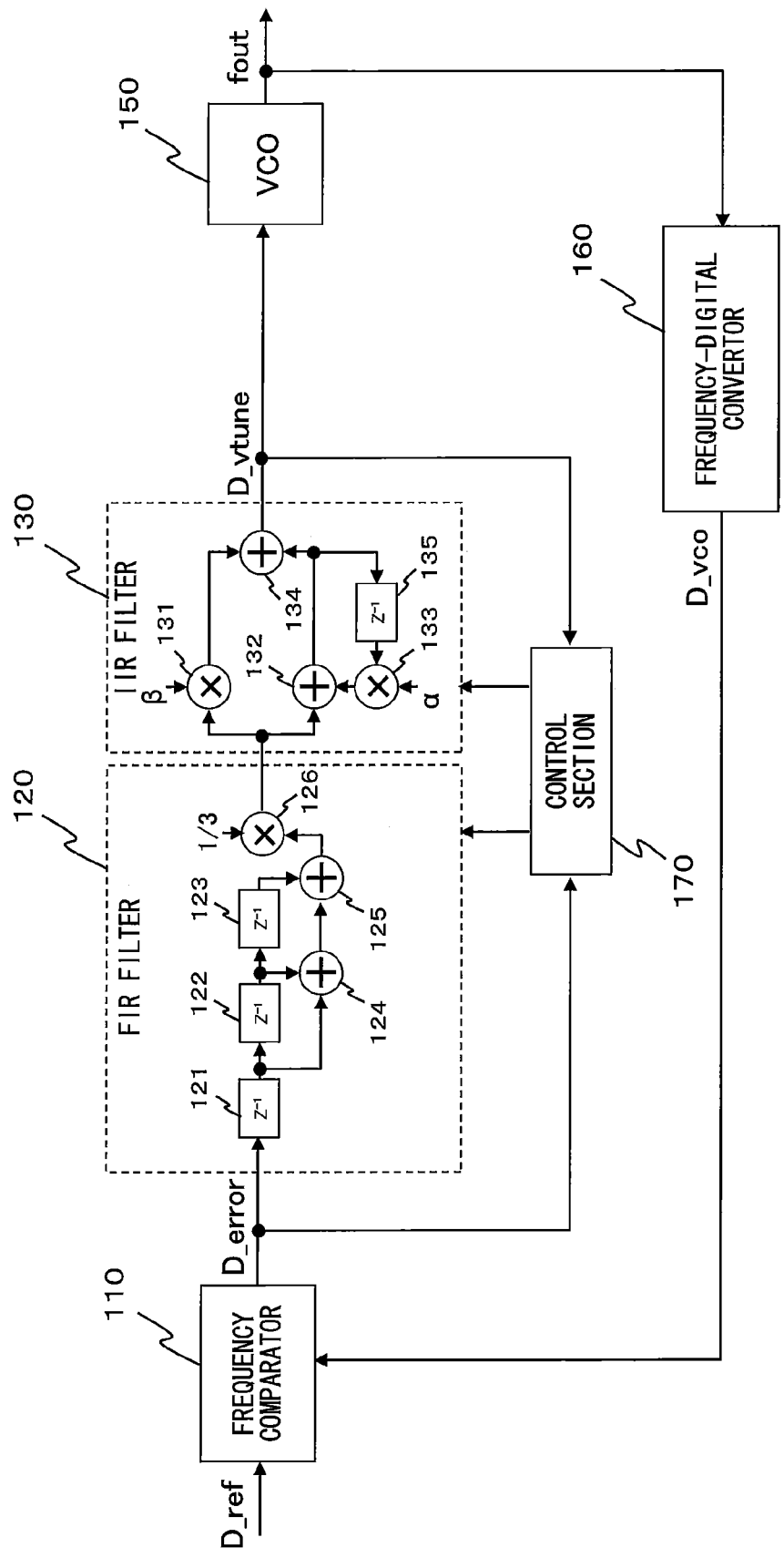
FIG. 1 is a diagram illustrating a digital FLL 100 according to a first embodiment of the present invention.

FIG. 1 is a diagram illustrating a digital FLL 100 according to a first embodiment of the present invention. In FIG. 1, the digital FLL 100 includes a frequency comparator 110, an FIR filter 120, an IIR filter 130, a VCO 150, a frequency-digital convertor 160, and a control section 170. The digital FLL 100 according to the first embodiment of the present invention is typically applied to a frequency synthesizer.

The frequency comparator 110 compares a channel signal D_ref inputted to the digital FLL 100 to a loopback signal D_vco and outputs a frequency error signal D_error between the channel signal D_ref and the loopback signal D_vco. The FIR filter 120 and the IIR filter 130 output a control voltage signal D_vtune on the basis of the frequency error D_error outputted from the frequency comparator 110.

Here, the FIR filter 120 includes first to third delay blocks $Z^{-1}$ 121 to 123, first and second adders 124 and 125, and a multiplier 126 having a fixed multiplying factor of ⅓. The FIR filter 120 performs a moving average process on the frequency error D_error by using the first to third delay blocks $Z^{-1}$ 121 to 123. Further, the IIR filter 130 includes first and second multipliers 131 and 133, first and second adders 132 and 134, and a delay block $Z^{-1}$ 135.

An output of the FIR filter 120 is inputted to the first multiplier 131 and the first adder 132 of the IIR filter 130. The first multiplier 131 multiplies the output of the FIR filter 120 by a weighting factor β. The first adder 132 adds an output of the second multiplier 133 to the output of the FIR filter 120. The second multiplier 133 multiplies an output of the first adder 132 looped back via the delay block $Z^{-1}$ 135, by a weighting factor α. The second adder 134 sums an output of the first multiplier 131 and an output of the first adder 132, and outputs the summed output as the control voltage signal D_vtune.

The control voltage signal D_vtune is inputted to the VCO 150. The VCO 150 controls an oscillation frequency fout outputted from the VCO 150, on the basis of the inputted control voltage signal. Here, a loopback path through which the oscillation frequency fout generated by the VCO 150 is looped back to the frequency comparator 110 includes the frequency-digital convertor 160. The oscillation frequency fout generated by the VCO 150 is digital-converted by the frequency-digital convertor 160 and returns as the loopback signal D_vco to the frequency comparator 110.

In this manner, the digital FLL 100 generates the control voltage signal D_vtune on the basis of the frequency error signal D_error between the channel signal D_ref and the loopback signal D_vco, and further controls the oscillation frequency fout outputted from the VCO 150, on the basis of the control voltage signal D_vtune.

The configuration and the operation of the digital FLL 100 described so far are the same as the configuration and the operation of the digital FLL 900 in the conventional art. The digital FLL 100 according to the first embodiment of the present invention further includes the control section 170. Hereinafter, the difference between the digital FLL 100 according to the first embodiment of the present invention and the digital FLL 900 in the conventional art will be described in detail with a description concerning an operation of the control section 170.

Figure 2:
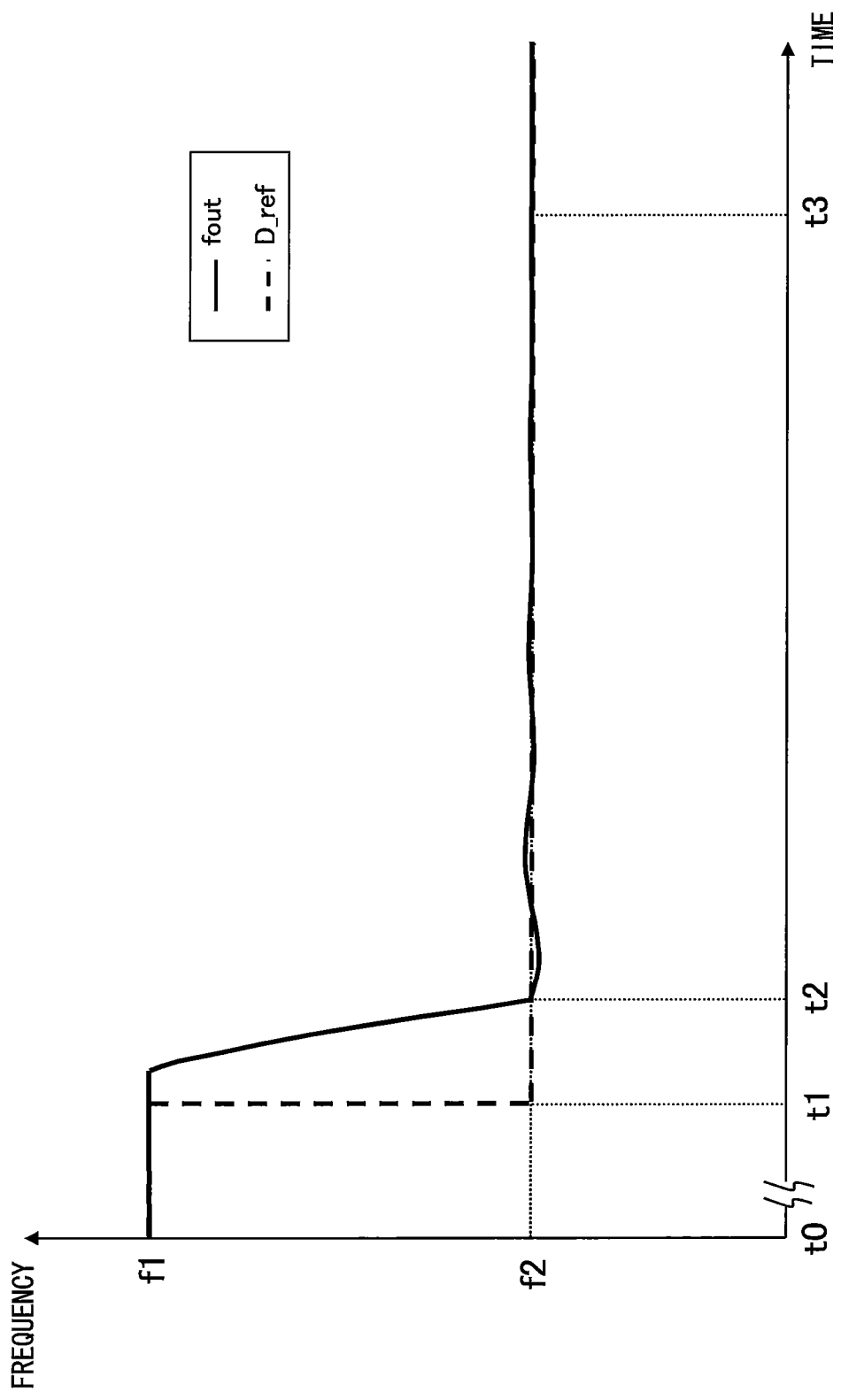
FIG. 2 is a diagram illustrating a situation where an oscillation frequency fout from a VCO 150 of the digital FLL 100 according to the first embodiment of the present invention converges to a desired frequency.

FIG. 2 is a diagram illustrating a situation where the oscillation frequency fout from the VCO 150 of the digital FLL 100 according to the first embodiment of the present invention converges to a desired frequency. In FIG. 2, between times t0 and t1, the reference frequency of the channel signal D_ref and the oscillation frequency fout from the VCO 150 are in a stationary state at the same frequency f1.

Figure 13:
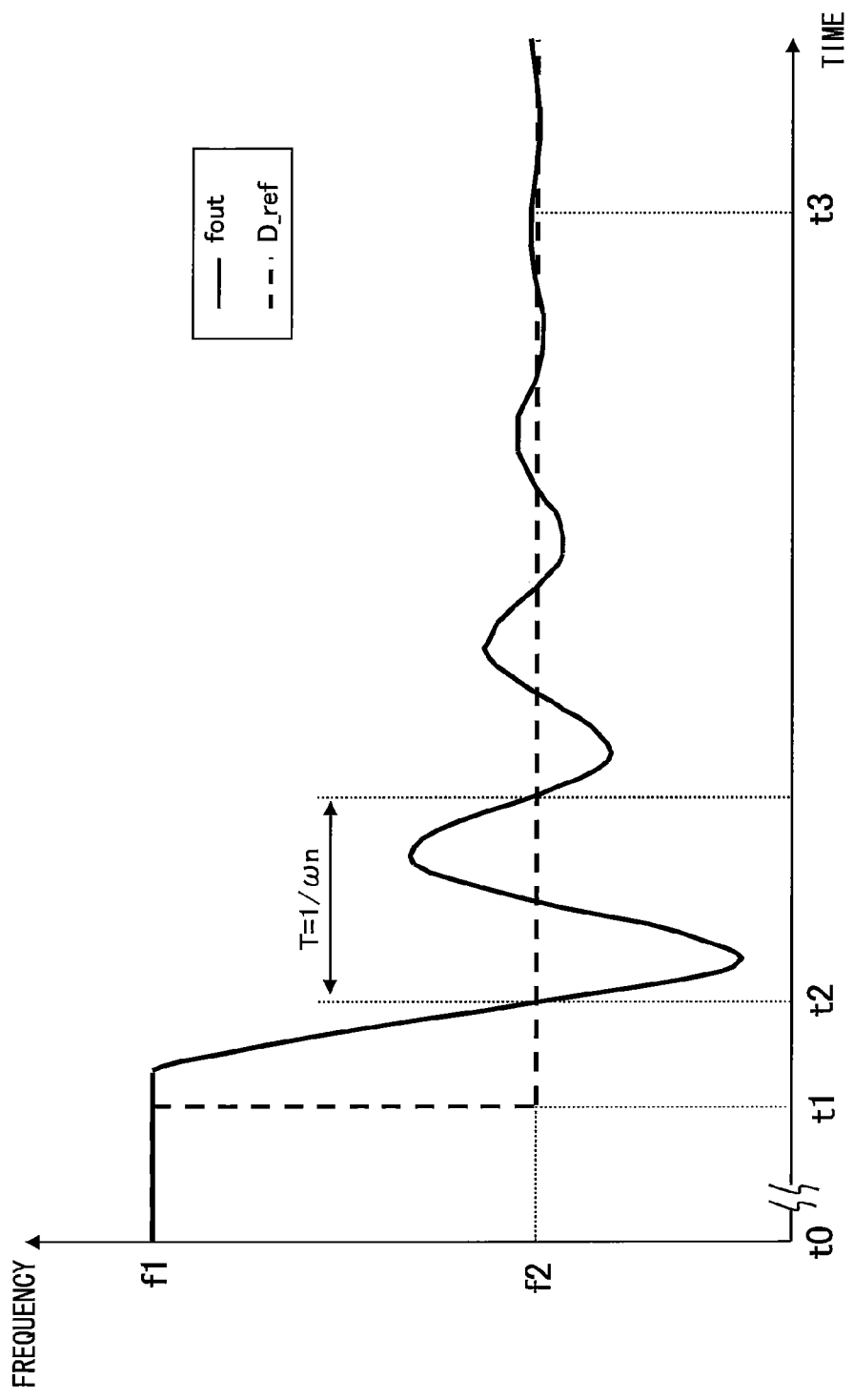
FIG. 13 is a diagram illustrating a situation where an oscillation frequency fout from a VCO 950 of the digital FLL 900 in the conventional art converges to a desired frequency.

When the frequency of the channel signal D_ref is switched from f1 to f2 at time t1, the oscillation frequency fout from the VCO 150 does not instantly come into a stationary state at the frequency f2. However, the oscillation frequency fout from the VCO 150 does not converge to the desired frequency f2 with repeated vibrations, as illustrated in FIG. 13, between times t2 and t3, but substantially comes into a stationary state at the desired frequency f2 at time t2. This is because at time t2, the control section 170 controls the FIR filter 120 and the IIR filter 130 on the basis of the frequency error signal D_error.

FIG. 3 is a flowchart illustrating the operation of the control section 170 of the digital FLL 100 according to the first embodiment of the present invention. Further, FIG. 4A is a diagram illustrating the frequency error signal D_error that is an output from the frequency comparator 110, D_FIR that is an output from the FIR filter 120, and D_IIR_B that is an output from the first multiplier 131 of the IIR filter 130. FIG. 4B is a diagram illustrating D_IIR_A that is an output from the first adder 132 of the IIR filter 130, and D_IIR_C that is an output from the second multiplier 133 of the IIR filter 130. Hereinafter, timings of operations of the digital FLL 100 will be described with reference to FIGS. 3, 4A, and 4B.

Figure 14A:
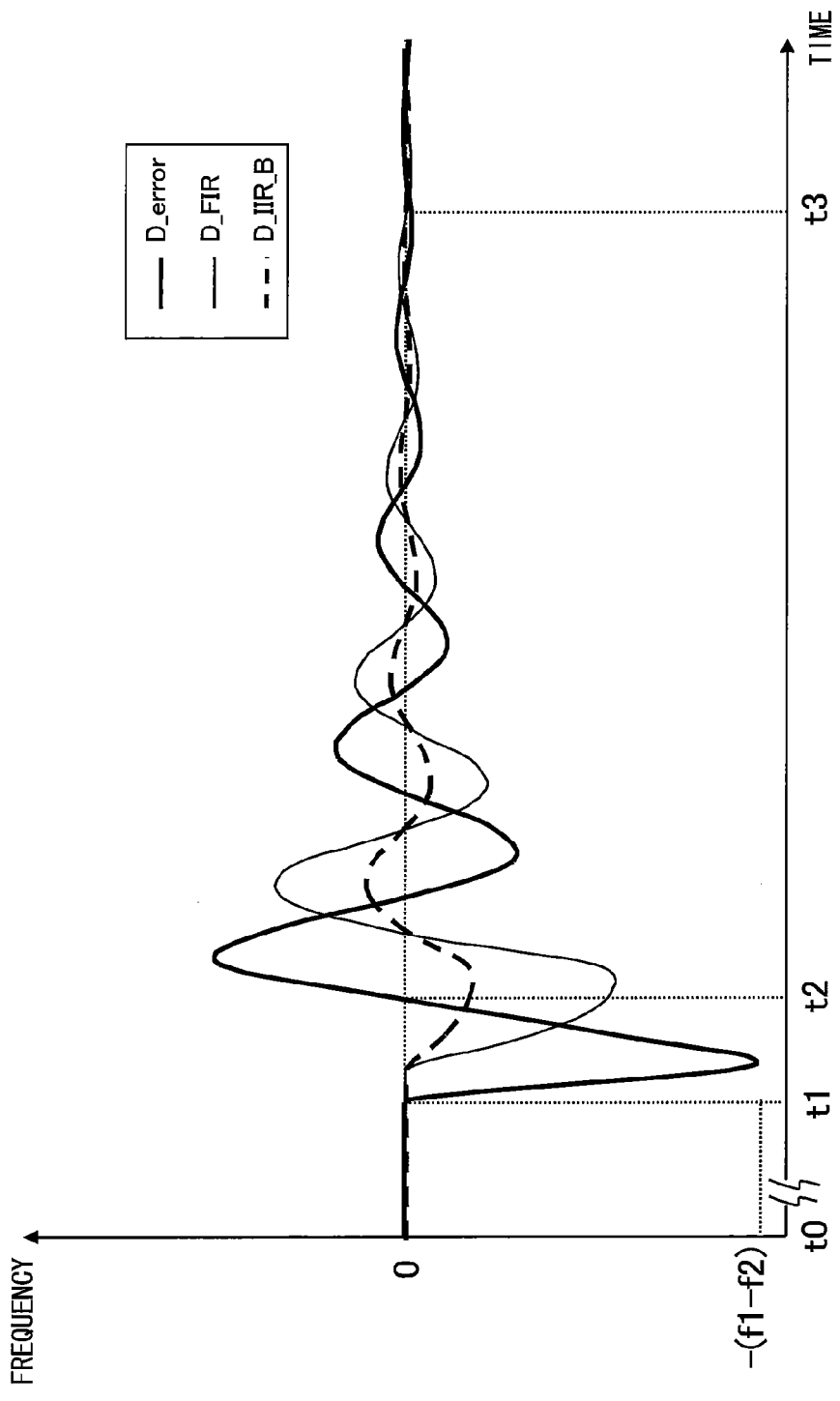
FIG. 14A is a diagram illustrating a frequency error signal D_error that is an output from a frequency comparator 910, D_FIR that is an output from an FIR filter 920, and D_IIR_B that is an output from a first multiplier 931 of an IIR filter 930.
Figure 14B:
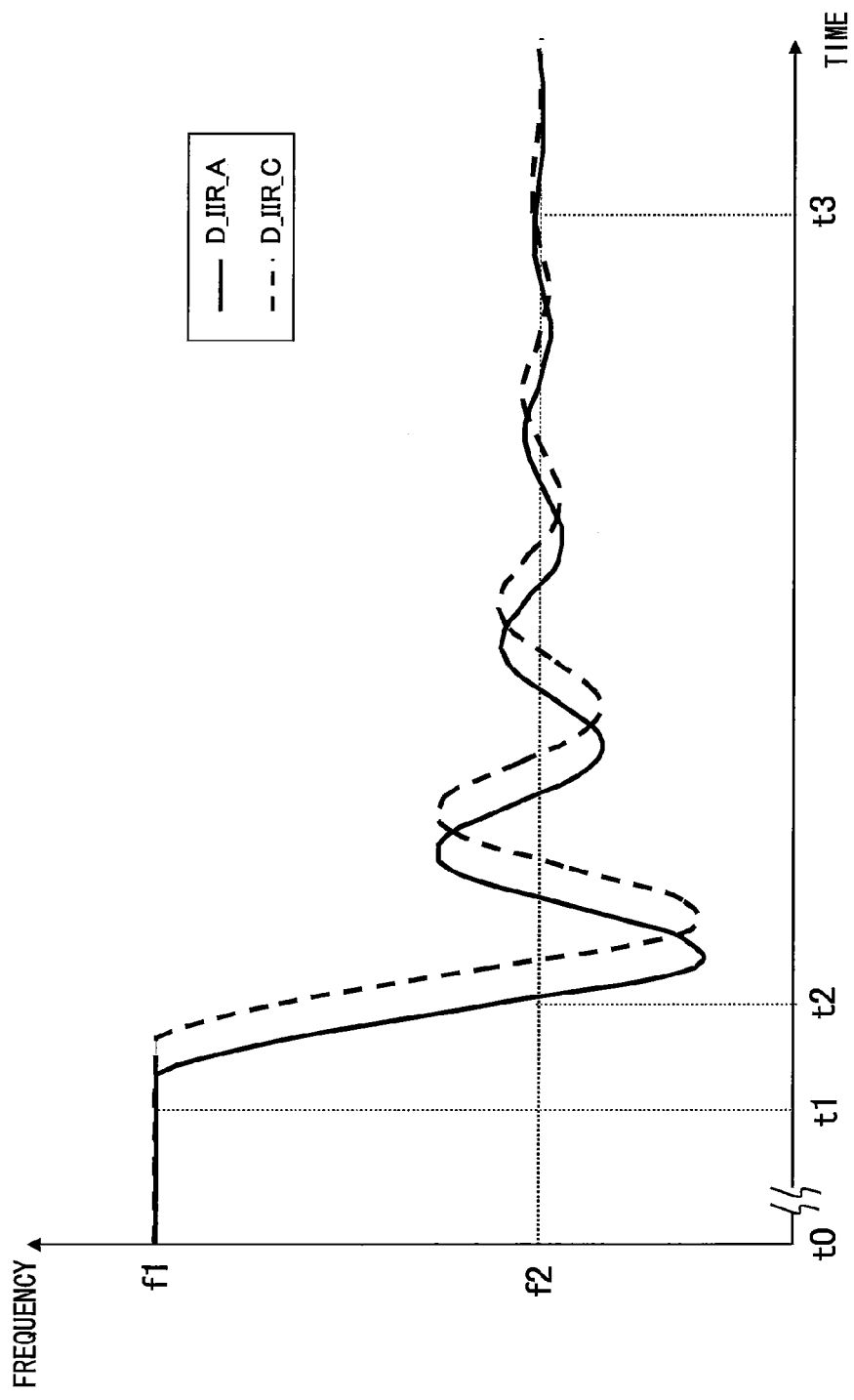
FIG. 14B is a diagram illustrating D_IIR_A that is an output from a first adder 932 of the IIR filter 930, and D_IIR_C that is an output from a second multiplier 933 of the IIR filter 930.

Between times t0 and t1 between which the oscillation frequency fout from the VCO 150 is in a stationary state at the frequency f1, the frequencies of the frequency error signal D_error, D_FIR, and D_IIR_B are in a stationary state at 0 in FIG. 4A, and the frequencies of D_IIR_A and D_IIR_C are in a stationary state at f1 in FIG. 4B. This is the same as the stationary state illustrated in FIGS. 14A and 14B.

In FIG. 3, when the frequency of the channel signal D_ref is switched from f1 to f2 (at time t1 in FIG. 2), the control section 170 starts a process for converging the oscillation frequency fout from the VCO 150, to a desired frequency at a high speed. Then, the control section 170 executes steps S101 to S104 in order.

At step S101, the control section 170 monitors the frequency error signal D_error, which is from the frequency comparator 110. When the frequency error signal D_error does not meet a predetermined condition, the control section 170 continues to monitor the frequency error signal D_error (No at step S102). It should be noted that between times t1 and t2, in FIG. 4A, D_error, D_FIR, and D_IIR_B exhibit the same characteristics as those in FIG. 14A, and in FIG. 4B, D_IIR_A and D_IIR_C exhibit the same characteristics as those in FIG. 14B.

When the frequency error signal D_error meets the predetermined condition after the frequency of the channel signal D_ref is switched from f1 to f2, namely, when the control section 170 detects that the frequency error signal D_error meets the predetermined condition after starting the monitoring of the frequency error signal D_error, the control section 170 proceeds to a process at step S103 (Yes at step S102). At step S103, the control section 170 obtains the control voltage signal D_vtune, which is the output from the IIR filter 130, and proceeds to a process at step S104.

Here, the control section 170 can determine whether or not the frequency error signal D_error meets the predetermined condition, on the basis of whether or not the frequency error signal D_error is 0. In other words, when the frequency error signal D_error is not 0 such as between times t1 and t2 in FIG. 2, the control section 170 continues to monitor the frequency error signal D_error (No at step S102). When the control section 170 detects that the frequency error signal D_error is 0 after starting the monitoring of the frequency error signal D_error (e.g., at time t2 in FIG. 4A), the control section 170 proceeds to the process at step S103 (Yes at step S102).

Alternatively, the control section 170 may detect whether or not the frequency error signal D_error meets the predetermined condition, on the basis of whether or not the frequency error signal D_error is within a predetermined range based on 0. It should be noted that the predetermined range based on 0 is preferably close to 0. In this case, when the control section 170 detects that the frequency error signal D_error is within the predetermined range based on 0 after starting the monitoring of the frequency error signal D_error, the control section 170 advances the processing to step S103 (Yes at step S102). This is for assuredly advancing the operation to steps subsequent to the step S103 even when the frequency error signal D_error does not completely become 0 due to reasons of digital signal processing.

Figure 4C:
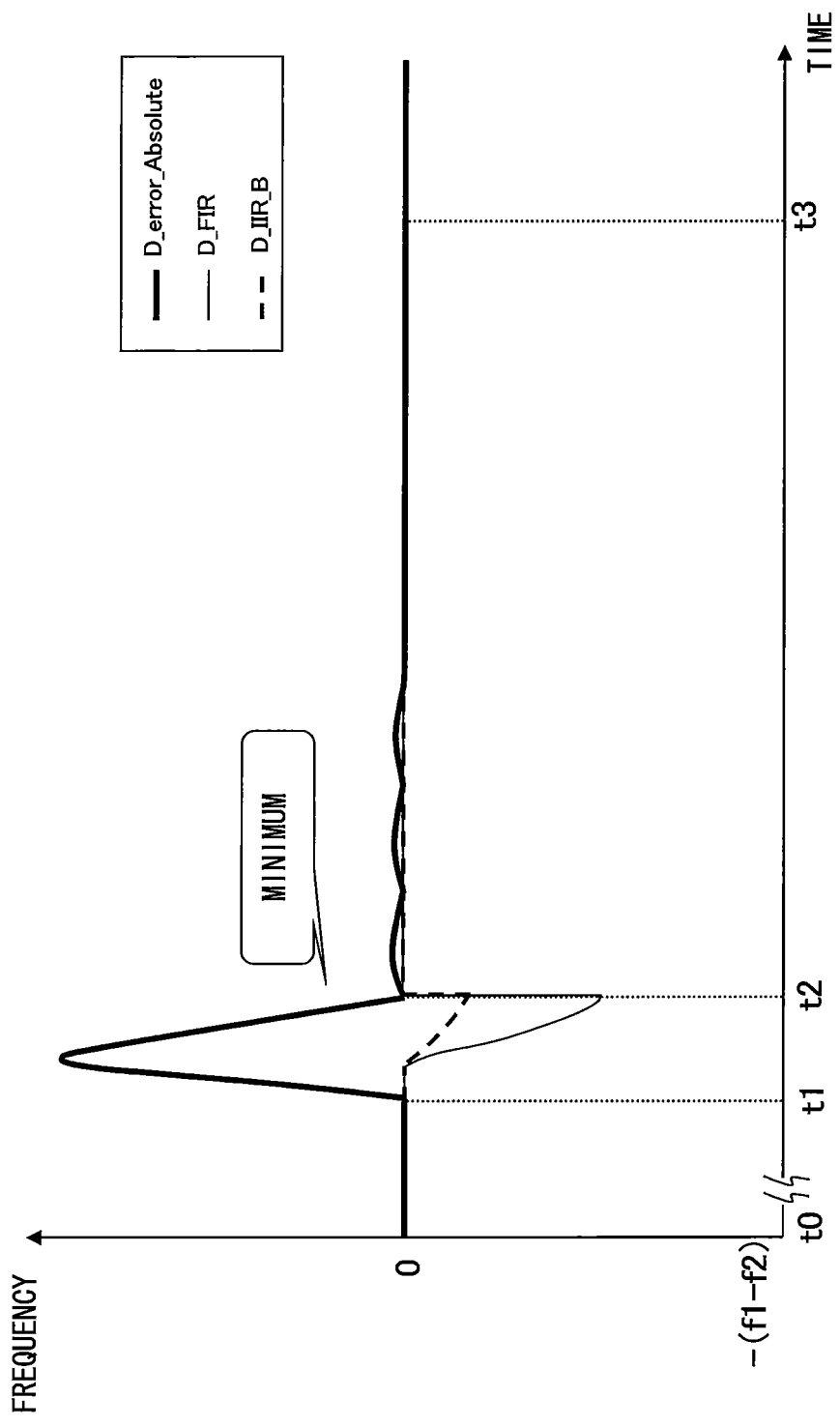
FIG. 4C is a diagram representing the absolute value of the frequency error signal D_error illustrated in FIG. 4A.

Alternatively, the control section 170 may detect whether or not the frequency error signal D_error meets the predetermined condition, on the basis of whether or not the absolute value of the frequency error signal D_error is minimum. FIG. 4C is a diagram representing the absolute value of the frequency error signal D_error illustrated in FIG. 4A. FIG. 4C illustrates the case where the absolute value of the frequency error signal D_error reaches minimum at time t2. When the control section 170 detects that the absolute value of the frequency error signal D_error is minimum after starting the monitoring of the frequency error signal D_error (e.g., at time t2 in FIG. 4C), the control section 170 advances the processing to step S103 (Yes at step S102).

At step S104, the control section 170 sets 0 to the first to third delay blocks $Z^{-1}$ 121 to 123 of the FIR filter 120, and sets the control voltage signal D_vtune obtained at step S103 to the delay block $Z^{-1}$ 135 of the IIR filter 130. By so doing, at time t2, the frequencies of D_FIR and D_IIR_B become 0 in FIG. 4A, and the frequencies of D_IIR_A and D_IIR_C become f2 in FIG. 4A.

Here, the FIR filter 120 and the IIR filter 130 of the digital FLL 100 according to the first embodiment of the present invention will be compared to the FIR filter 920 and the IIR filter 930 of the digital FLL 900 in the conventional art. At step S104, the control section 170 sets 0 to the first to third delay blocks $Z^{-1}$ 121 to 123 of the FIR filter 120, and sets the control voltage signal D_vtune obtained at step S103 to the delay block $Z^{-1}$ 135 of the IIR filter 130, whereby at time t2, the FIR filter 120 and the IIR filter 130 of the digital FLL 100 according to the first embodiment of the present invention come into a state that is the same as that at time t3 of the FIR filter 920 and the IIR filter 930 of the digital FLL 900 in the conventional art (see FIG. 13).

Therefore, the oscillation frequency fout from the VCO 150 of the digital FLL 100 according to the first embodiment of the present invention does not converge to the desired frequency f2 with repeated vibrations as illustrated in FIG. 13, between times t2 and t3, but substantially comes into a stationary state at the desired frequency f2 at time t2.

As described above, according to the digital FLL 100 according to the first embodiment of the present invention, at time t2 when the control section 170 detects that the frequency error signal D_error meets the predetermined condition, the control section 170 controls the digital loop filter into a stationary state (a state at time t3 in FIG. 13), whereby the oscillation frequency fout from the VCO 150 can be converged to the desired frequency at a high speed.

Further, according to the digital FLL 100 according to the first embodiment of the present invention, a stationary state is provided in a short time after the frequency of the channel signal is switched, and thus each device can be set in a sleep mode and reduction of current consumption can be achieved.

Further, in order to maximally exert the effects of the present invention, the digital FLL 100 may operate, for example, as follows. At step S101 in FIG. 3, the control section 170 monitors the frequency error signal D_error, which is from the frequency comparator 110. At that time, the control section 170 may use a temporal average of the frequency error signal D_error for monitoring the frequency error signal D_error. By so doing, the control section 170 can reduce the influence of a noise component included in the frequency error signal D_error, when monitoring the frequency error signal D_error.

Further, at step S103 in FIG. 3, similarly, the control section 170 may use a temporal average of the control voltage signal D_vtune for obtaining the control voltage signal D_vtune. By so doing, the control section 170 can reduce the influence of the noise component included in the control voltage signal D_vtune, when obtaining the control voltage signal D_vtune.

By using the temporal average of at least either one of the frequency error signal D_error or the control voltage signal D_vtune as described above, the control section 170 can set a value that reduces the influence of the noise component, at step S104.

Figure 4D:
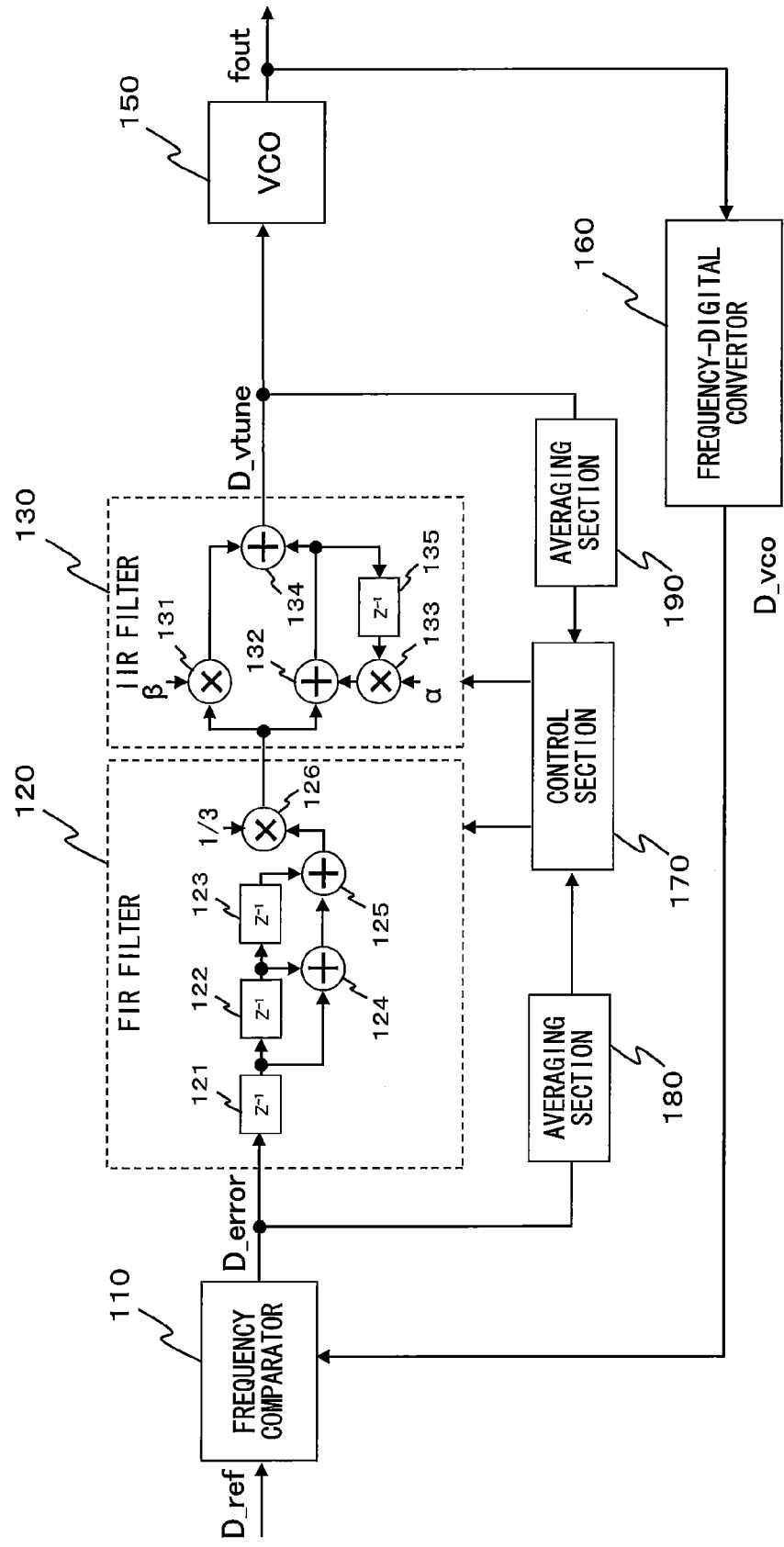
FIG. 4D is a diagram illustrating a digital FLL 100b according to the first embodiment of the present invention.

Further, in the example described above, the control section 170 calculates the temporal averages of the frequency error signal D_error and the control voltage signal D_vtune. However, a component other than the control section 170 may calculate them. In this case, the digital FLL circuit 100 may be configured to further include, for example, at least either one of an averaging section 180 or an averaging section 190 as in a digital FLL 100b illustrated in FIG. 4D. The averaging section 180 calculates a temporal average of the frequency error signal D_error outputted from the frequency comparator 110, and outputs the temporal average to the control section 170. The averaging section 190 calculate a temporal average of the control voltage signal D_vtune, and outputs the temporal average to the control section 170.

It should be noted that since the influence of the noise component is reduced as described above, it is effective to calculate the temporal averages of the frequency error signal D_error and the control voltage signal D_vtune. However, if the timing of determining at step S102 whether or not the predetermined condition is met and the timing of obtaining the control voltage signal D_vtune at step S103 are out of synchronization with each other, the effects of the present invention are reduced. Thus, the frequency error signal D_error and the control voltage signal D_vtune are desirably temporally averaged at the same level.

Further, for the timing of obtaining the control voltage signal D_vtune at step S103, it is desirable to take into consideration a delay time occurring at the frequency-digital convertor 160. In other words, the control section 170 desirably has a function to correct a delay time occurring between an input and an output of the loopback path.

Figure 4E:
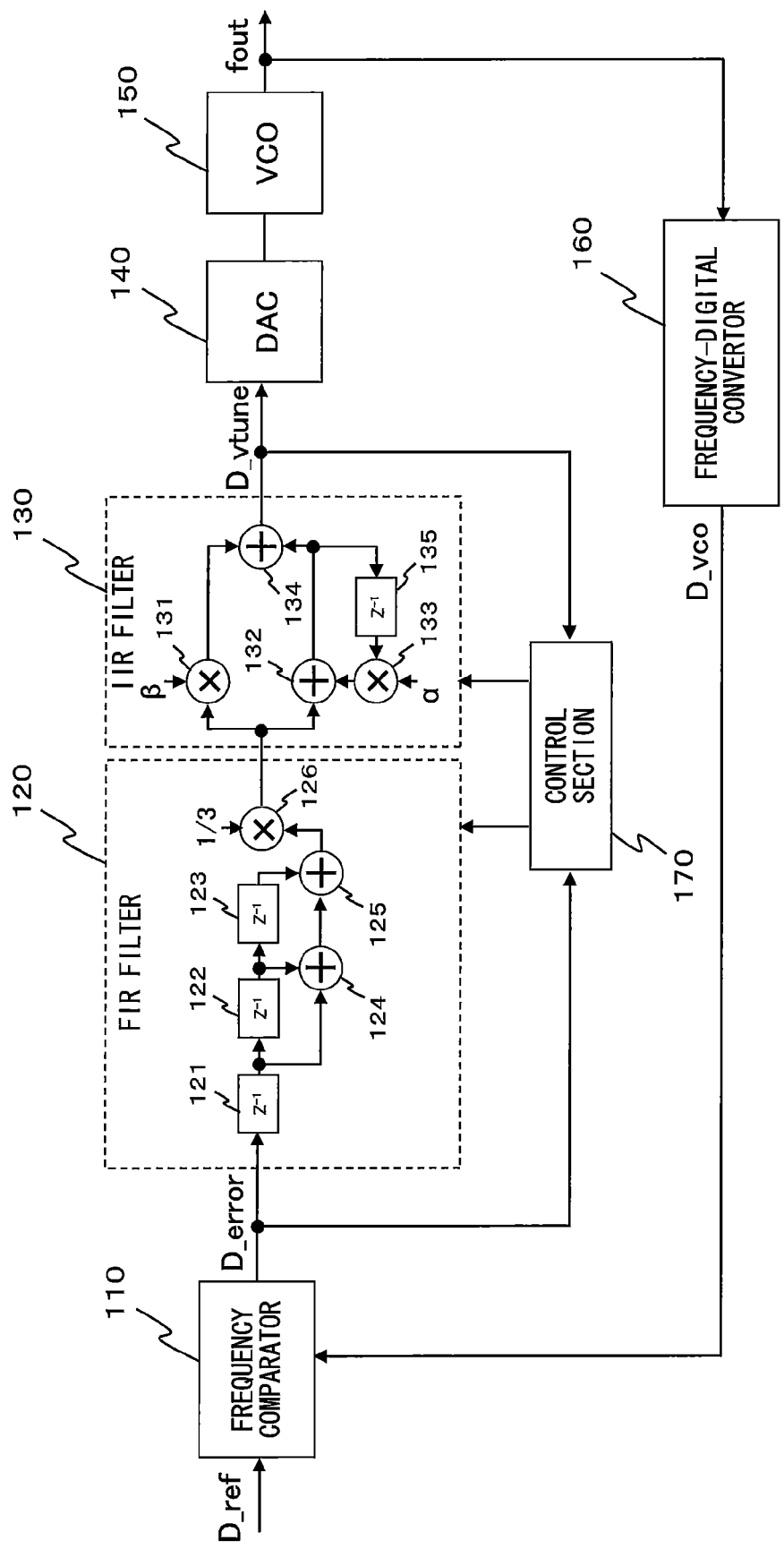
FIG. 4E is a diagram illustrating a digital FLL 100c according to the first embodiment of the present invention.

Further, the digital FLL 100 according to the first embodiment may be configured to further include a DAC 140 as in a digital FLL 100c illustrated in FIG. 4E. The DAC 140 performs digital-analogue conversion on the control voltage signal D_vtune generated by the IIR filter 130, and outputs the resultant signal to the VCO 150.

Further, other than the frequency synthesizer, the digital FLL 100 according to the first embodiment of the present invention may be applied to a frequency modulation circuit. The frequency modulation circuit performs frequency modulation on an inputted modulation signal, and outputs the resultant signal as a frequency modulation signal.

(Second Embodiment)

Figure 5:
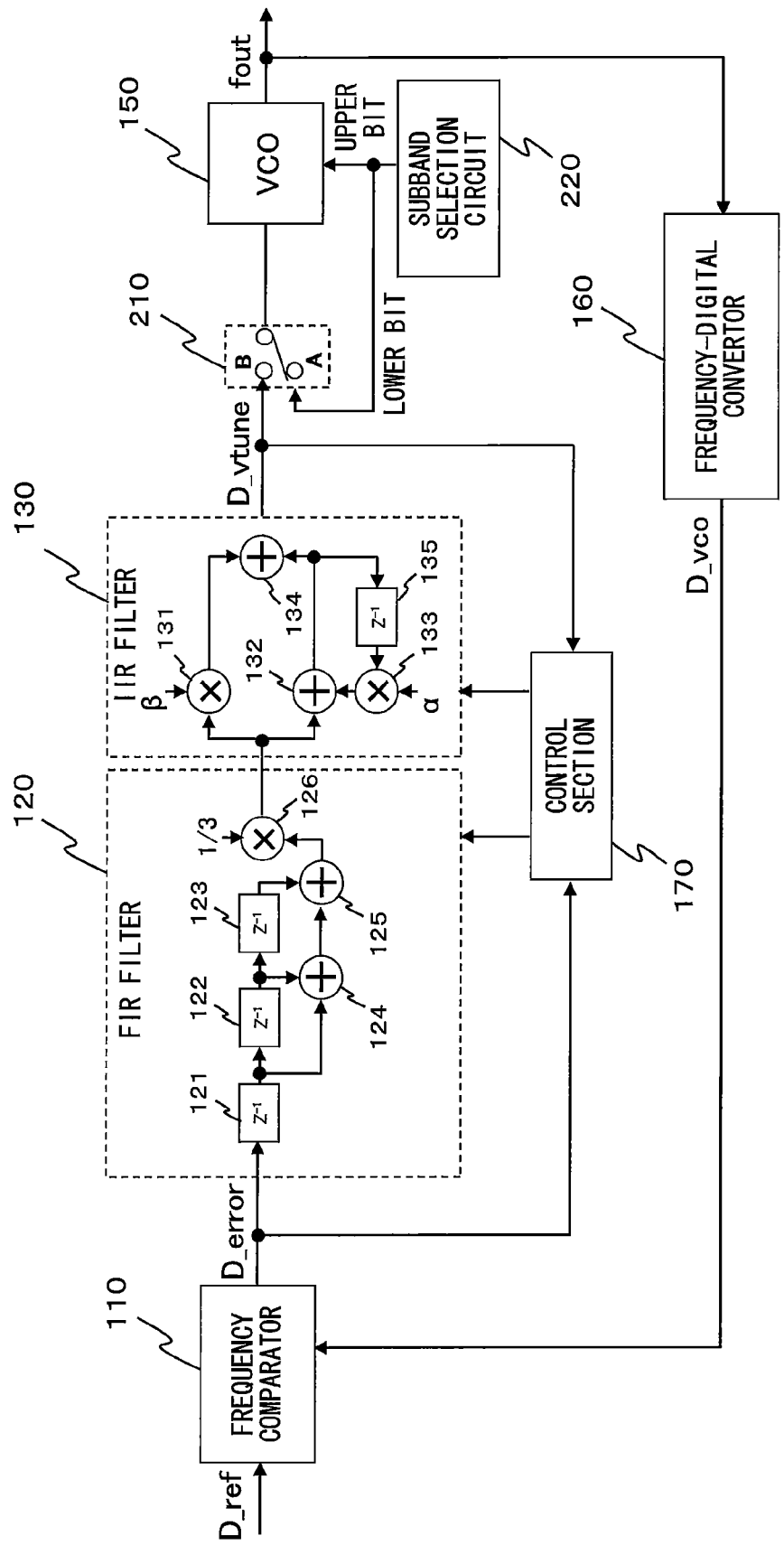
FIG. 5 is a diagram illustrating a digital FLL 200 according to a second embodiment of the present invention.

FIG. 5 is a diagram illustrating a digital FLL 200 according to a second embodiment of the present invention. In FIG. 5, the digital FLL 200 includes a frequency comparator 110, an FIR filter 120, an IIR filter 130, a VCO 150, a frequency-digital convertor 160, a control section 170, a switch 210, and a subband selection circuit 220. The digital FLL 200 according to the second embodiment of the present invention differs from the digital FLL 100 according to the first embodiment of the present invention in including the switch 210 between the IIR filter 130 and the VCO 150 and in including the subband selection circuit 220 for selecting a subband. In FIG. 5, the same components as those in FIG. 1 are designated by the same reference characters, and the detailed description thereof is omitted. In the present embodiment, the difference from the digital FLL 100 according to the first embodiment of the present invention will be described in detail.

Figure 6:
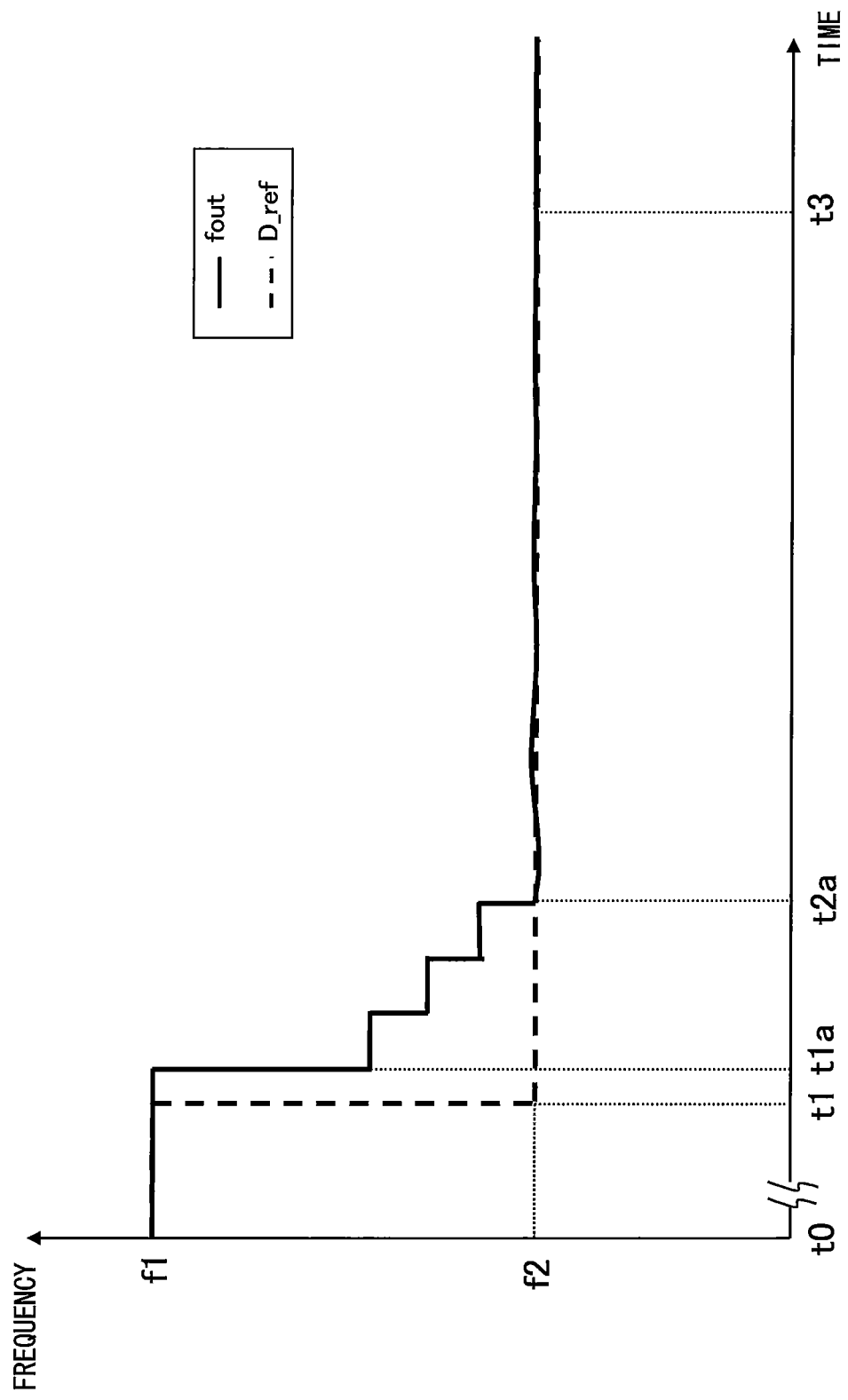
FIG. 6 is a diagram illustrating a situation where an oscillation frequency fout from a VCO 150 of the digital FLL 200 according to the second embodiment of the present invention converges to a desired frequency.

FIG. 9 is a diagram illustrating a situation where an oscillation frequency fout from the VCO 150 of the digital FLL 200 according to the second embodiment of the present invention converges to a desired frequency. In FIG. 6, between times t0 and t1, the reference frequency of a channel signal D_ref and the oscillation frequency fout from the VCO 150 are in a stationary state at the same frequency f1.

When the frequency of the channel signal D_ref is switched from f1 to f2 at time t1, the oscillation frequency fout from the VCO 150 does not instantly come into a stationary state at the frequency f2, and substantially come into a stationary state at the desired frequency f2 at time t2a. The digital FLL 200 performs subband selection between times t1 and t1a and changes a control voltage to the VCO 150 between times t1a and t2a, thereby causing the frequency error signal D_error to approach 0.

FIG. 7 is a flowchart illustrating an operation of the digital FLL 200 according to the second embodiment of the present invention. In FIG. 7, when the frequency of the channel signal D_ref is switched from f1 to f2 (at time t1 in FIG. 6), the digital FLL 200 starts a process for converging the oscillation frequency fout from the VCO 150, to a desired frequency at a high speed. Then, the digital FLL 200 executes steps S201 to S210 in order.

At step S201, the digital FLL 200 switches an input terminal of the switch 210 to the terminal A side to connect the subband selection circuit 220 to the VCO 150.

At step S202, a lower bit outputted from the subband selection circuit 220 is fixed.

By steps S201 and S202, the lower bit outputted from the subband selection circuit 220 is inputted as a control voltage signal to the VCO 150 via the switch 210. Since the lower bit outputted from the subband selection circuit 220 is fixed at step S202, the control voltage signal inputted to the VCO 150 is also fixed.

Figure 8A:
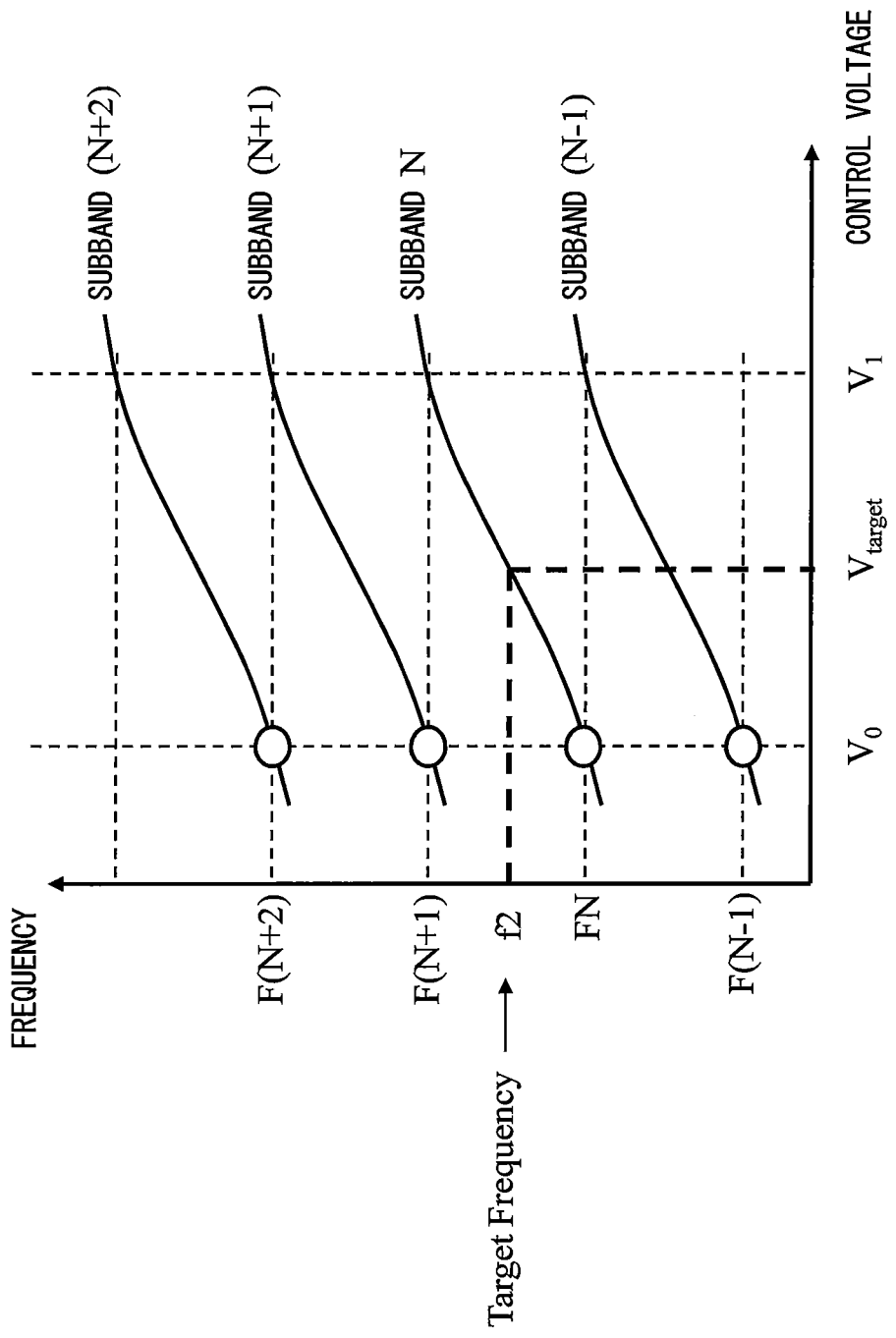
FIG. 8A is a diagram illustrating relationships between a control voltage inputted to the VCO 150 and an oscillation frequency when subbands (N−1) to (N+2) are selected.

At step S203, an upper bit outputted from the subband selection circuit 220 is changed, whereby subband selection is performed while a subband setting is changed. Here, the subband selection will be described. FIG. 8A is a diagram illustrating relationships between the control voltage inputted to the VCO 150 and an oscillation frequency when subbands (N−1) to (N+2) are selected. In the present embodiment, by fixing the lower bit outputted from the subband selection circuit 220, the control voltage inputted to the VCO 150 is fixed, and the subband selection is performed. In FIG. 8A, for example, by fixing the control voltage inputted to the VCO 150 at Vo and changing the upper bit outputted from the subband selection circuit 220, a subband in which the oscillation frequency is the desired frequency f2 is searched for while the subband setting is changed. Examples of the method of searching for a subband include binary search.

As described above, by changing the upper bit outputted from the subband selection circuit 220, the subband setting is repeatedly changed (No at step S204), a subband N that meets that $FN \leq f2 < F(N+1)$ is selected as illustrated in FIG. 8A (Yes at step S204, time t1a in FIG. 6).

At step S205, after the subband selection is completed (Yes at step S204), the upper bit outputted from the subband selection circuit 220 is fixed.

At step S206, the lower bit outputted from the subband selection circuit 220 is changed to change the control voltage inputted to the VCO 150.

The VCO 150 controls the oscillation frequency fout outputted from the VCO 150, on the basis of the inputted control voltage signal. The oscillation frequency fout outputted from the VCO 150 is inputted as a loopback signal D_vco to the frequency comparator 110 via the frequency-digital convertor 160. The frequency comparator 110 compares the channel signal D_ref to the loopback signal D_vco and outputs a frequency error signal D_error between the channel signal D_ref and the loopback signal D_vco.

In this manner, the lower bit outputted from the subband selection circuit 220 is changed to change the control voltage inputted to the VCO 150 and further to change the loopback signal D_vco. Thus, the frequency error signal D_error outputted from the frequency comparator 110 is also changed.

Similarly as described in the first embodiment of the present invention, the control section 170 monitors the frequency error signal D_error. When the frequency error signal D_error does not meet a predetermined condition, the lower bit outputted from the subband selection circuit 220 is changed such that the frequency error signal D_error approaches 0 (No at step S207).

When the frequency error signal D_error meets the predetermined condition, namely, when the control section 170 detects that the frequency error signal D_error meets the predetermined condition, the control section 170 proceeds to a process at step S208 (Yes at step S207).

The control section 170 can determine whether or not the frequency error signal D_error meets the predetermined condition, similarly as in the first embodiment. For example, when the frequency error signal D_error is not 0 (between times t1a and t2a in FIG. 6), the control section 170 changes the lower bit outputted from the subband selection circuit 220 such that the frequency error signal D_error approaches 0 (No at step S207). When the frequency error signal D_error is 0 (at time t2a in FIG. 6), namely, when the control section 170 detects that the frequency error signal D_error is 0, the control section 170 proceeds to the process at step S208 (Yes at step S207). Alternatively, the control section 170 may detect whether or not the frequency error signal D_error meets the predetermined condition, on the basis of whether or not the frequency error signal D_error is within a predetermined range based on 0 or whether or not the absolute value of the frequency error signal D_error is minimum.

At step S208, the control section 170 obtains the control voltage signal D_vtune that is an output from the IIR filter 130, and proceeds to a process at step S209.

At step S209, the control section 170 sets 0 to first to third delay blocks $Z^{-1}$ 121 to 123 of the FIR filter 120, and sets the control voltage signal D_vtune obtained at step S103 to a delay block $Z^{-1}$ 135 of the IIR filter 130.

At step S210, the digital FLL 200 switches the input terminal of the switch 210 to the terminal B side to connect the IIR filter 130 to the VCO 150.

As described above, according to the digital FLL 200 according to the second embodiment of the present invention, after the subband selection is performed, the control voltage inputted to the VCO 150 is changed in order to cause the frequency error signal D_error to approach 0. At time t2a when the control section 170 detects that the frequency error signal D error meets the predetermined condition, the control section 170 controls the digital loop filter into a stationary state (the state at time t3 in FIG. 13), whereby the oscillation frequency fout from the VCO 150 can be converged to the desired frequency at a high speed.

Further, according to the digital FLL 200 according to the second embodiment of the present invention, a stationary state is provided in a short time after the frequency of the channel signal is switched, and thus each device can be set in a sleep mode and reduction of current consumption can be achieved.

Figure 8B:
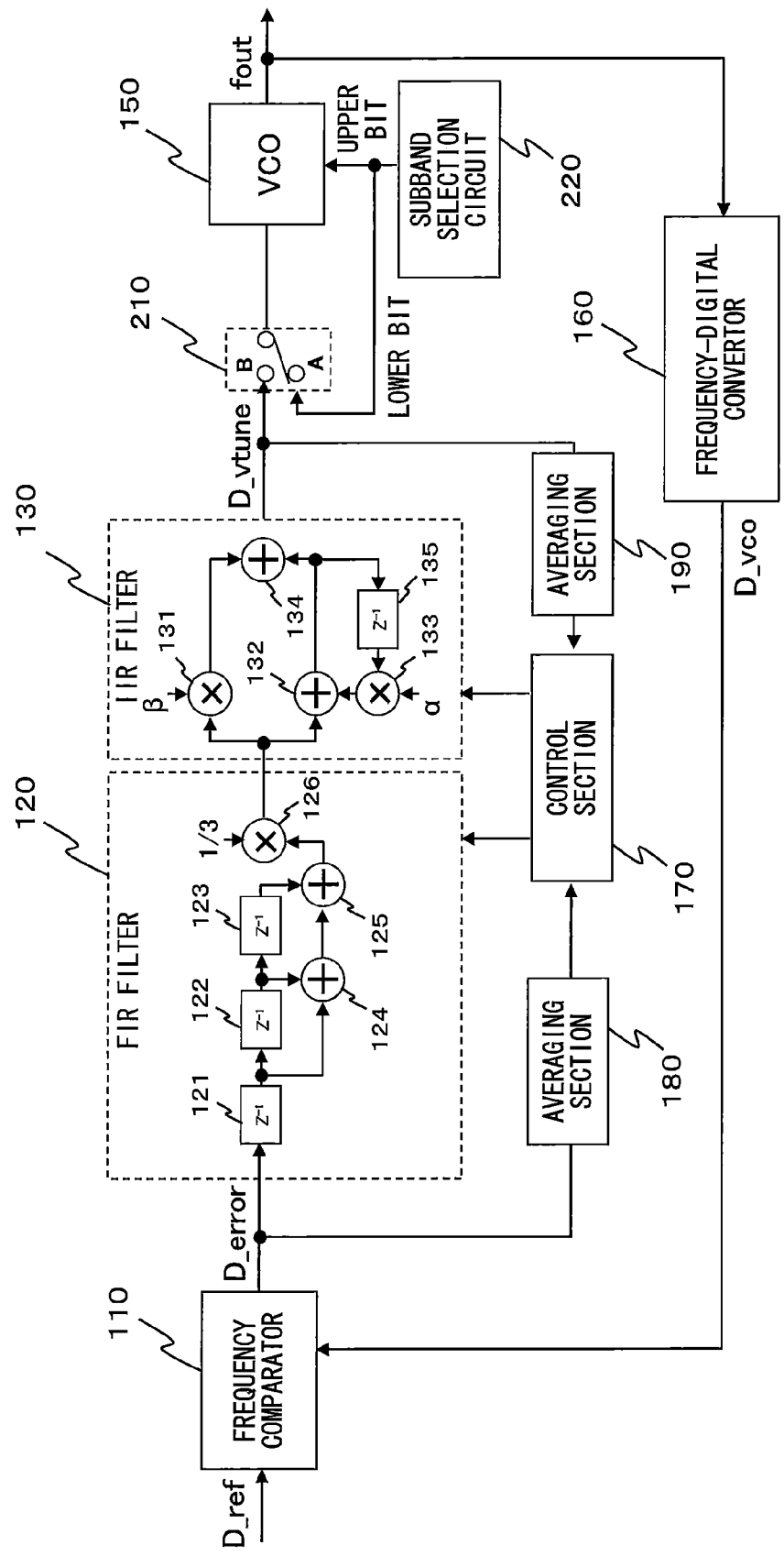
FIG. 8B is a diagram illustrating a digital FLL 200b according to the second embodiment of the present invention.

Similarly as in the first embodiment, the digital FLL circuit 200 according to the second embodiment may be configured to further include at least either one of an averaging section 180 or an averaging section 190 as in a digital FLL 200b illustrated in FIG. 8B. The averaging section 180 calculates a temporal average of the frequency error signal D_error outputted from the frequency comparator 110, and outputs the temporal average to the control section 170. The averaging section 190 calculates a temporal average of the control voltage signal D_vtune, and outputs the temporal average to the control section 170.

Figure 8C:
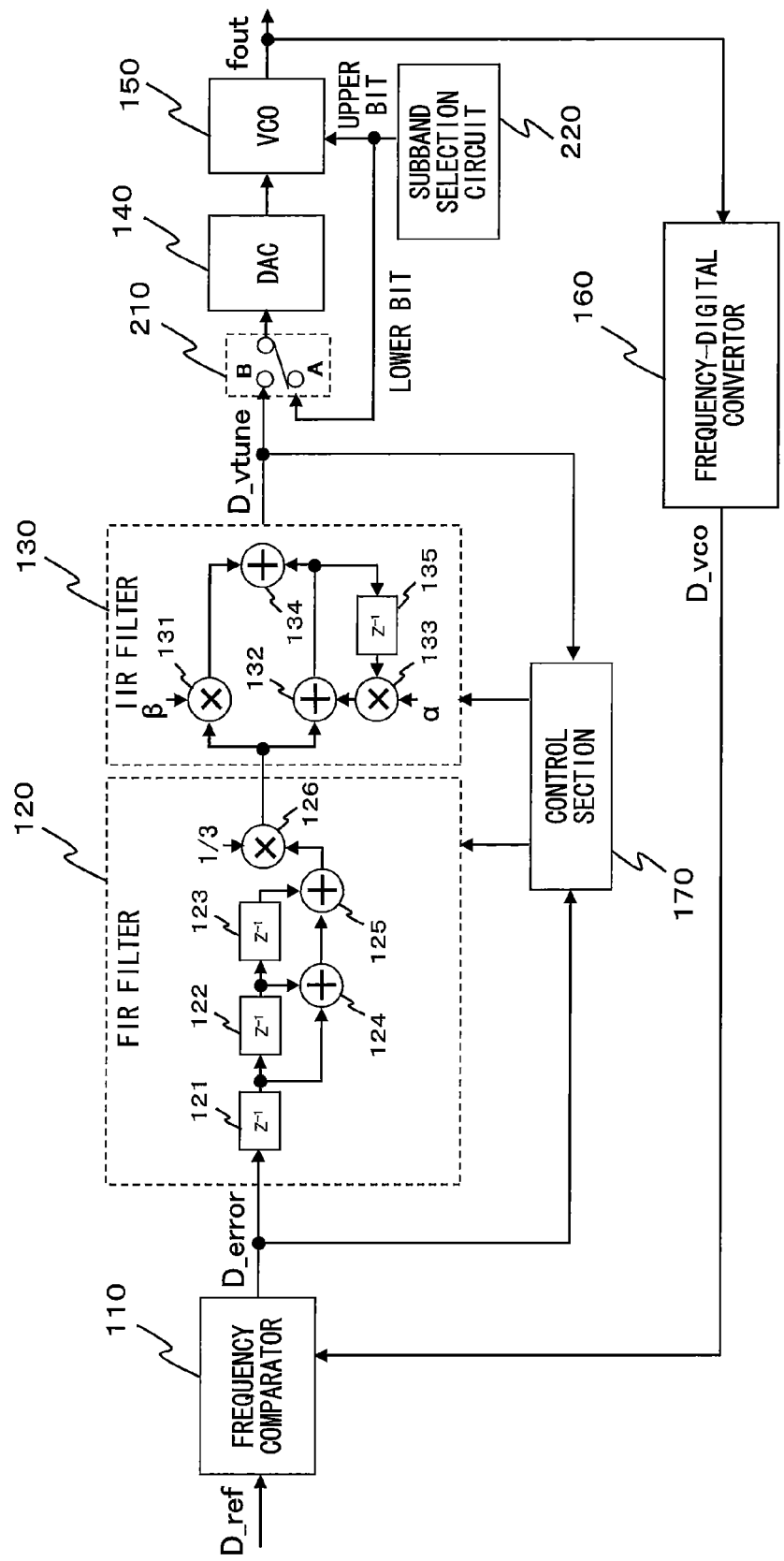
FIG. 8C is a diagram illustrating a digital FLL 200c according to the second embodiment of the present invention.

Further, the digital FLL 200 according to the second embodiment may be configured to further include a DAC 140 between the switch 210 and the VCO 150 as in a digital FLL 200c illustrated in FIG. 8C. Hereinafter, an operation different from that in FIG. 7 when the digital FLL 200b includes the DAC 140 will be described. At step S201, the digital FLL 200b switches the input terminal of the switch 210 to the terminal A side to connect the subband selection circuit 220 to the DAC 140. By steps S201 and S202, the lower bit outputted from the subband selection circuit 220 is inputted to the DAC 140 via the switch 210. The signal inputted to the DAC 140 is analogue-converted by the DAC 140 and then inputted as a control voltage signal to the VCO 150.

(Third Embodiment)

The digital FLLs 100 and 200 described in the first and second embodiments of the present invention can be applied as a digital PLL used in a wireless communication device or the like.

Figure 9A:
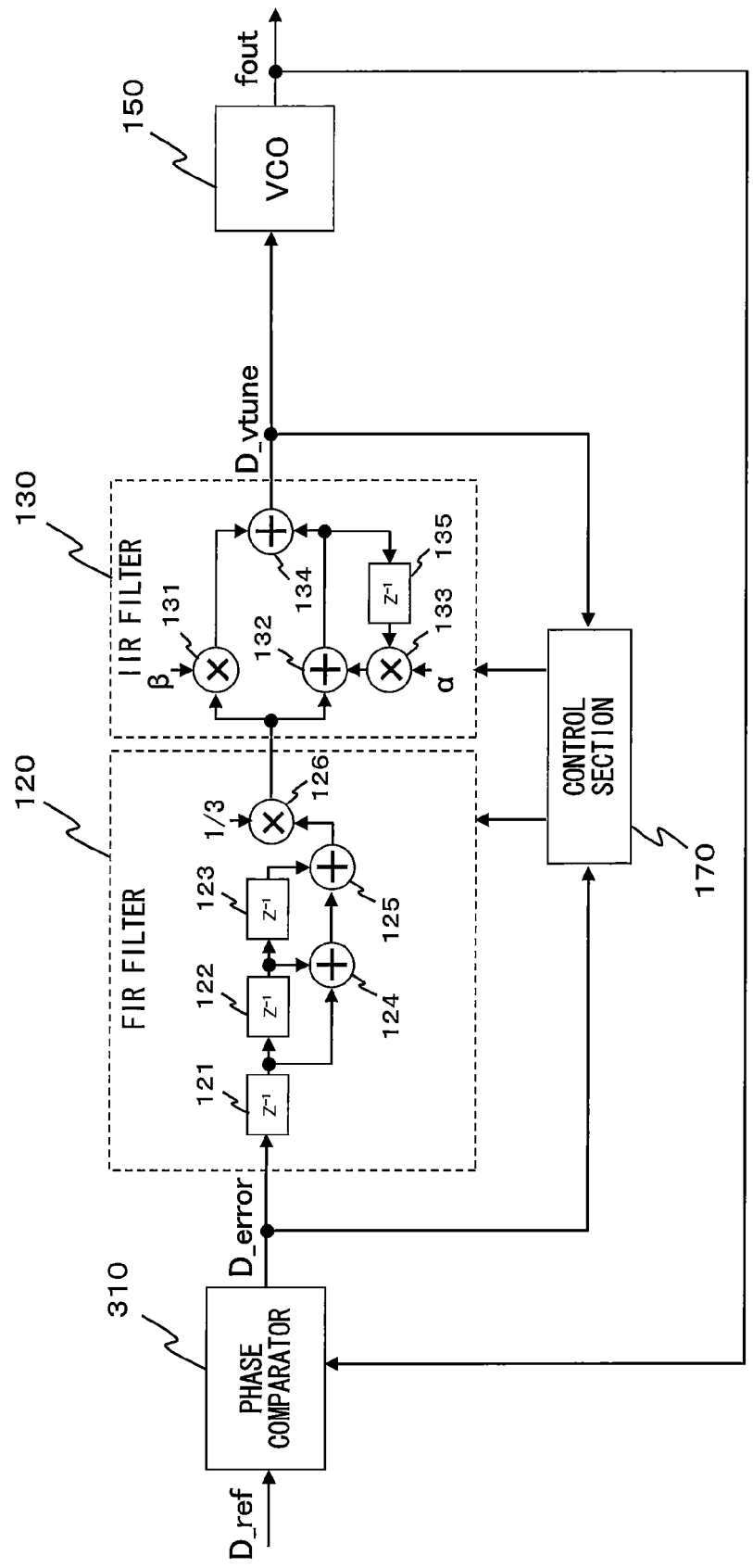
FIG. 9A is a diagram illustrating a digital PLL 300 according to a third embodiment of the present invention.

FIG. 9A is a diagram illustrating a digital PLL 300 according to a third embodiment of the present invention. In FIG. 9A, the digital PLL 300 includes a phase comparator 310, an FIR filter 120, an IIR filter 130, a VCO 150, and a control section 170. The digital PLL 300 according to the third embodiment of the present invention differs from the digital FLL 100 according to the first embodiment of the present invention illustrated in FIG. 1, in including the phase comparator 310 instead of the frequency comparator 110 and in not including the frequency-digital convertor 160.

In the digital PLL 300, an oscillation frequency outputted from the VCO 150 is inputted as a loopback signal to the phase comparator 310 without any changes. The phase comparator 310 compares a channel signal D_ref to the loopback signal and outputs a phase error signal D_error between the channel signal D_ref and the loopback signal. In addition, a loopback path through which the oscillation frequency fout generated by the VCO 150 is looped back to the phase comparator 310 typically includes a DAC. The other process is the same as that of the digital FLL 100 according to the first embodiment of the present invention illustrated in FIG. 1, and needless to say, the same effects are obtained.

Figure 9B:
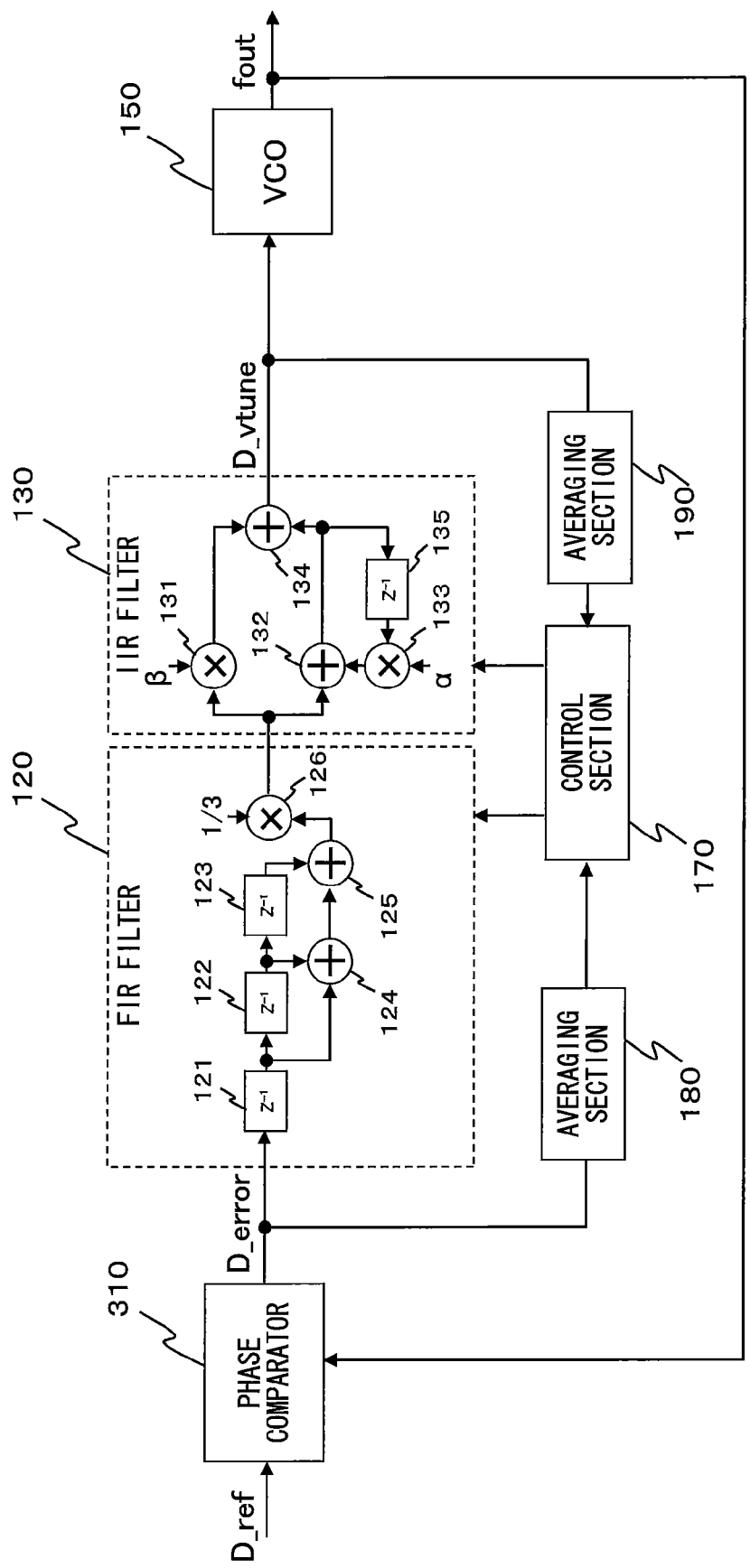
FIG. 9B is a diagram illustrating a digital PLL 300b according to the third embodiment of the present invention.
Figure 9C:
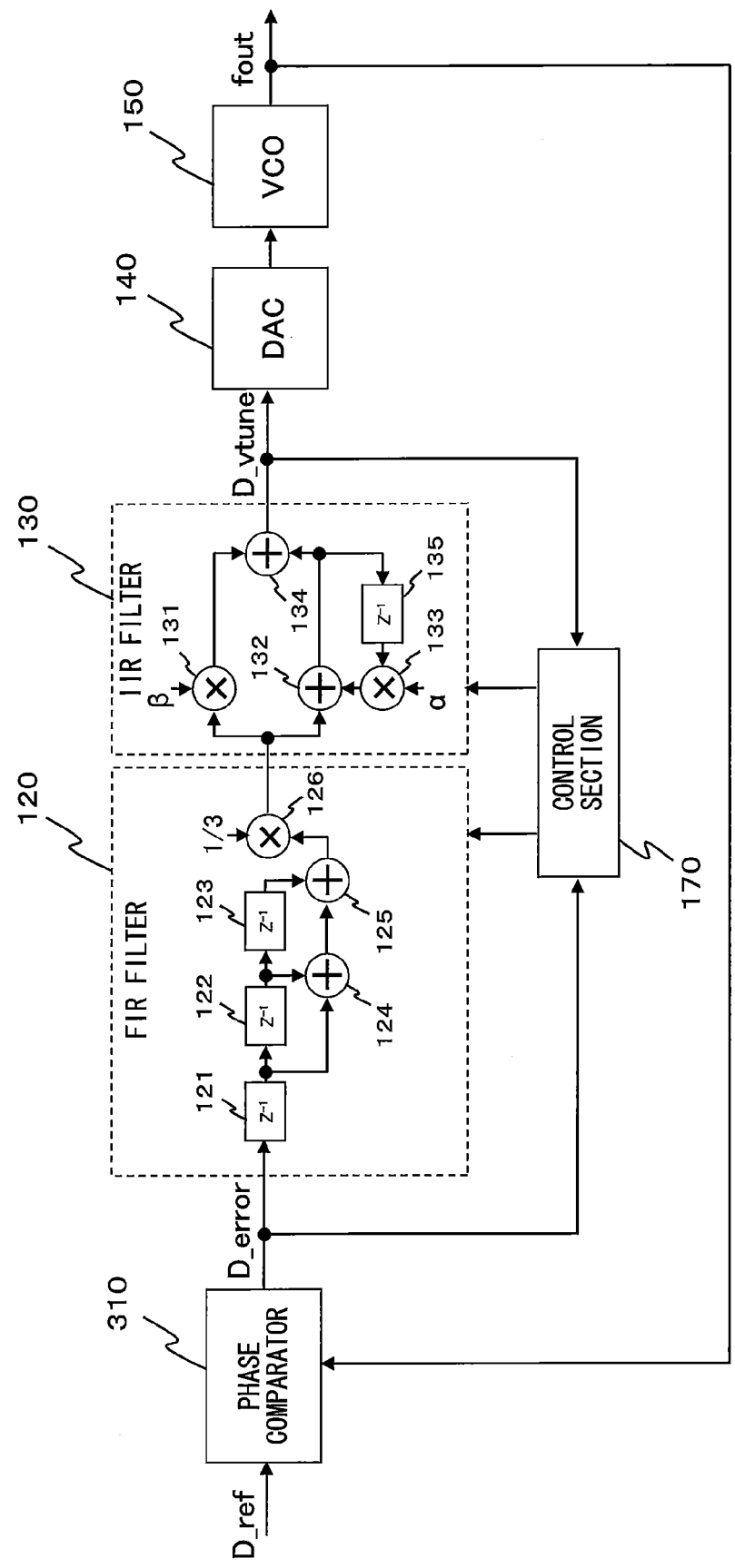
FIG. 9C is a diagram illustrating a digital PLL 300c according to the third embodiment of the present invention.

Similarly as in the first embodiment, the digital PLL circuit 300 according to the third embodiment may be configured to further include at least either one of an averaging section 180 or an averaging section 190 as in a digital FLL 300b illustrated in FIG. 9B. Further, the digital PLL 300 according to the third embodiment may be configured to further include a DAC 140 between the switch 210 and the VCO 150 as in a digital FLL 300c illustrated in FIG. 9C.

Needless to say, the digital FLL 200 described in the second embodiment can similarly be applied as a digital PLL.

(Fourth Embodiment)

Figure 10:
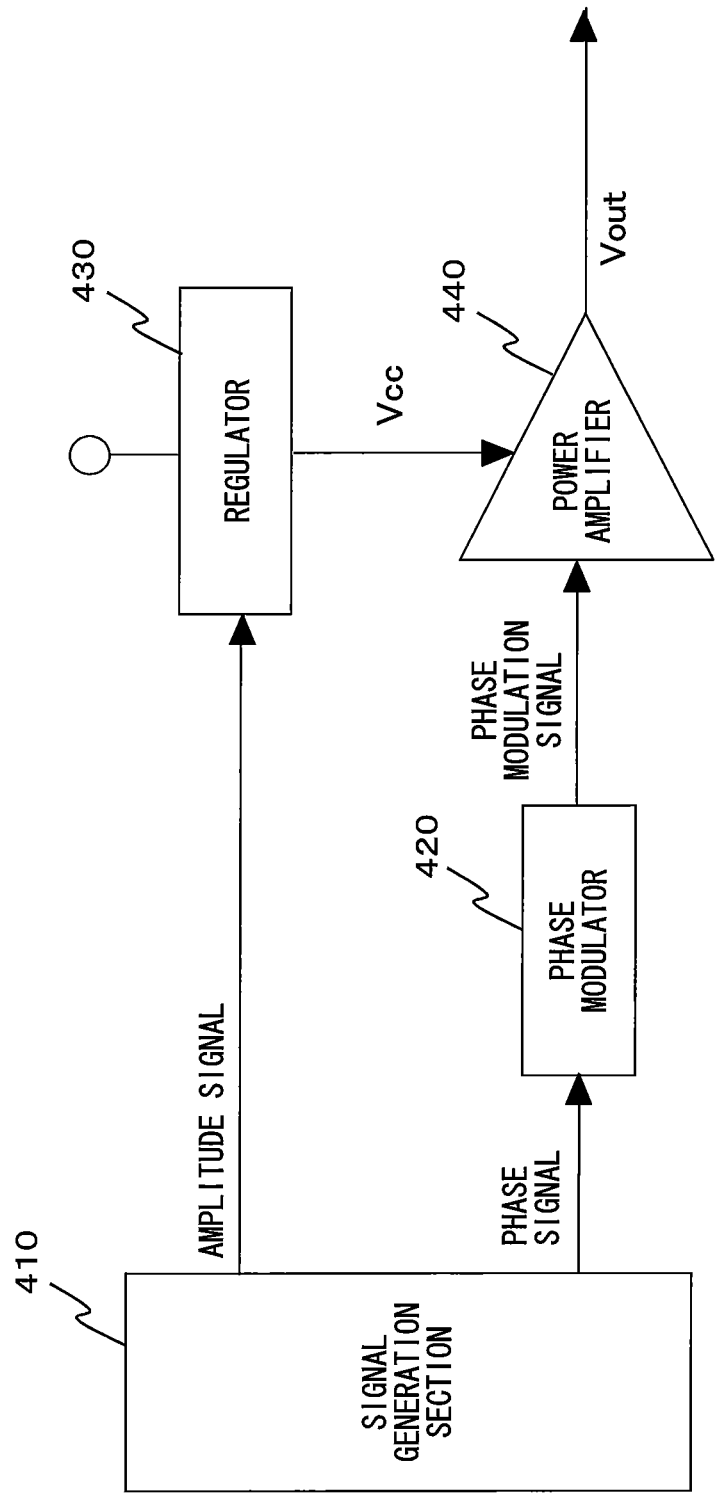
FIG. 10 is a diagram illustrating a polar modulation circuit 400 according to a fourth embodiment of the present invention.
Figure 12:
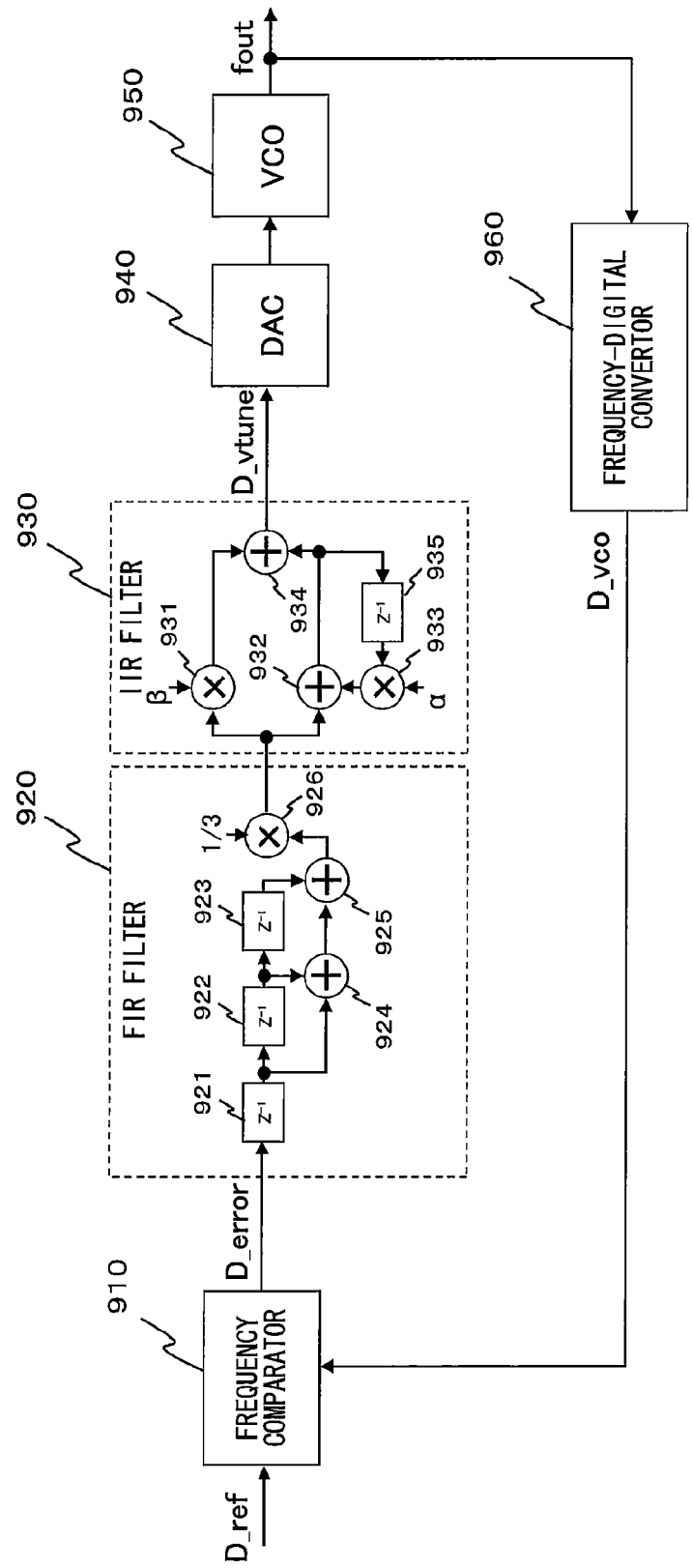
FIG. 12 is a diagram illustrating a digital FLL 900 in the conventional art.

FIG. 10 is a diagram illustrating a polar modulation circuit 400 according to a fourth embodiment of the present invention. In FIG. 40, the polar modulation circuit 400 includes a signal generation section 410, a phase modulator 420, a regulator 430, and a power amplifier 440.

In the polar modulation circuit 400, the signal generation section 410 generates an amplitude signal and a phase signal. The amplitude signal is inputted to the regulator 430. In addition, a direct-current voltage is supplied from a power supply terminal to the regulator 430. The regulator 430 supplies a voltage Vcc controlled in accordance with the inputted amplitude signal, to the power amplifier 440. Typically, the regulator 430 supplies a voltage Vcc proportional to the magnitude of the inputted amplitude signal, to the power amplifier 440. The phase signal generated by the signal generation section 410 is inputted to the phase modulator 420. The phase modulator 420 performs phase modulation on the phase signal and outputs a phase modulation signal. The power amplifier 440 amplifies the phase modulation signal with the voltage Vcc supplied from the regulator 430. A signal Vout resulting from the amplification by the power amplifier 440 is outputted as a transmission signal from an output terminal.

The digital FLL/PLL of the present invention can be incorporated as a modulator used in the phase modulator 420 of the polar modulation circuit 400.

(Fifth Embodiment)

FIG. 11 is a diagram illustrating a wireless communication device 500 according to a fifth embodiment of the present invention. In FIG. 11, the wireless communication device 500 includes an antenna 510, a power amplifier 520, a modulator 530, a switch 540, a low noise amplifier 550, a demodulator 506, and a digital FLL/PLL 570 of the present invention.

When transmitting a wireless signal, the modulator 530 modulates a desired high frequency signal outputted from the digital FLL/PLL 570, with a baseband modulation signal, and outputs the resultant signal. The high frequency modulation signal outputted from the modulator 530 is amplified by the power amplifier 520, and radiated from the antenna 510 via the switch 540.

When receiving a wireless signal, a high frequency modulation signal received by the antenna 510 is inputted into the low noise amplifier 550 via the switch 540, amplified, and inputted into the demodulator 506. The demodulator 506 demodulates the inputted high frequency modulation signal into a baseband modulation signal with the high frequency signal outputted from the digital FLL/PLL 570. A plurality of the digital FLL/PLLs 570 may be used on the transmission side and the reception side. Furthermore, the digital FLL/PLL 570 may also serve as a modulator.

INDUSTRIAL APPLICABILITY

The present invention can be used in a wireless communication device or the like, and is useful particularly for the case where it is desired to converge the oscillation frequency of a VCO to a desired frequency at a high speed, or the like.

DESCRIPTION OF THE REFERENCE CHARACTERS 100, 200, 900 digital FLL
110, 910 frequency comparator
120, 920 FIR filter
130, 930 IIR filter
140, 940 DAC
150, 950 VCO
160, 960 frequency-digital convertor
170 control section
180, 190 averaging section
121 to 123, 135, 921 to 923, 935 delay block $Z^{-1}$
124, 125, 132, 134, 924, 925, 932, 934 adder
126, 131, 133, 926, 931, 933 multiplier
210, 540 switch
220 subband selection circuit
300 digital PLL
310 phase comparator
400 polar modulation circuit
410 signal generation section
420 phase modulator
430 regulator
440, 520 power amplifier
500 wireless communication device
510 antenna
530 modulator
550 low noise amplifier
560 demodulator
570 digital FLL/PLL

The invention claimed is:

1. A digital frequency/phase locked loop for controlling an outputted oscillation frequency on the basis of a signal error that is a difference between an inputted channel signal and the oscillation frequency, the digital frequency/phase locked loop comprising:
a comparator for comparing the channel signal to a loopback signal having the oscillation frequency to generate the signal error;
a digital loop filter for generating a control voltage that determines the oscillation frequency, on the basis of the signal error;
a VCO for controlling an oscillation frequency on the basis of the control voltage;
a loopback path through which the oscillation frequency generated by the VCO is outputted as the loopback signal to the comparator; and
a control section for monitoring the signal error generated by the comparator, and controlling the digital loop filter such that the oscillation frequency of the VCO comes into a stationary state, when detecting that the signal error is within a predetermined range based on 0 after the channel signal is switched, wherein
the digital loop filter includes an FIR filter and an IIR filter, and
the control section (i) obtains the control voltage outputted by the digital loop filter, (ii) sets 0 to a delay block of the FIR filter, and (iii) sets the control voltage obtained from the digital loop filter to a delay block of the IIR filter.

2. The digital frequency/phase locked loop according to claim 1, wherein the control section monitors a temporal average of the signal error generated by the comparator.

3. The digital frequency/phase locked loop according to claim 1, wherein the control section has a function to correct a delay time occurring between an input and an output of the loopback path.

4. The digital frequency/phase locked loop according to claim 1, wherein the loopback path includes a frequency-digital convertor that performs analogue-digital conversion on the oscillation frequency generated by the VCO.

5. The digital frequency/phase locked loop according to claim 1, further comprising:
   a subband selection circuit for controlling selection of a subband in which the VCO oscillates at a desired frequency; and
   a switch, provided between the digital loop filter and the VCO, for switching between inputs of the control voltage generated by the digital loop filter and a control voltage from the subband selection circuit, wherein
   the subband selection circuit fixes a control voltage inputted to the VCO, during the selection of the subband,
   the subband selection circuit changes the control voltage inputted to the VCO, after the selection of the subband,
   the switch switches to connect the subband selection circuit to the VCO, at start of the selection of the subband, and
   the switch switches to connect the digital loop filter to the VCO, when the oscillation frequency of the VCO comes into a stationary state.

6. The digital frequency/phase locked loop according to claim 1, further comprising a DAC for performing digital-analogue conversion on the control voltage generated by the digital loop filter.

7. A wireless communication device using a digital frequency/phase locked loop according to claim 1.

8. A digital frequency/phase locked loop for controlling an outputted oscillation frequency on the basis of a signal error that is a difference between an inputted channel signal and the oscillation frequency, the digital frequency/phase locked loop comprising:
   a comparator for comparing the channel signal to a loopback signal having the oscillation frequency to generate the signal error;
   a digital loop filter for generating a control voltage that determines the oscillation frequency, on the basis of the signal error;
   a VCO for controlling an oscillation frequency on the basis of the control voltage;
   a loopback path through which the oscillation frequency generated by the VCO is outputted as the loopback signal to the comparator; and
   a control section for monitoring the signal error generated by the comparator, and controlling the digital loop filter such that the oscillation frequency of the VCO comes into a stationary state, when detecting that the signal error is within a predetermined range based on 0 after the channel signal is switched, wherein
   the control section monitors the signal error generated by the comparator, and controls
   the digital loop filter such that the oscillation frequency of the VCO comes into a stationary state, when detecting that the absolute value of the signal error is minimum after the channel signal is switched,
   the digital loop filter includes an FIR filter and an IIR filter, and
   the control section (i) obtains the control voltage outputted by the digital loop filter, (ii) sets 0 to a delay block of the FIR filter, and (iii) sets the control voltage obtained from the digital loop filter to a delay block of the IIR filter.

9. A digital frequency/phase locked loop for controlling an outputted oscillation frequency on the basis of a signal error that is a difference between an inputted channel signal and the oscillation frequency, the digital frequency/phase locked loop comprising:
   a comparator for comparing the channel signal to a loopback signal having the oscillation frequency to generate the signal error;
   a digital loop filter for generating a control voltage that determines the oscillation frequency, on the basis of the signal error;
   a VCO for controlling an oscillation frequency on the basis of the control voltage;
   a loopback path through which the oscillation frequency generated by the VCO is outputted as the loopback signal to the comparator; and
   a control section for monitoring the signal error generated by the comparator, and controlling the digital loop filter such that the oscillation frequency of the VCO comes into a stationary state, when detecting that the signal error is within a predetermined range based on 0 after the channel signal is switched, wherein
   the control section controls the digital loop filter by using a temporal average of the control voltage generated by the digital loop filter,
   the digital loop filter includes an FIR filter and an IIR filter, and
   the control section (i) obtains the control voltage outputted by the digital loop filter, (ii) sets 0 to a delay block of the FIR filter, and (iii) sets the control voltage obtained from the digital loop filter to a delay block of the IIR filter.

* * * * *